United States Patent
Komatsu et al.

(10) Patent No.: US 12,295,148 B2
(45) Date of Patent: May 6, 2025

(54) SEMICONDUCTOR MEMORY DEVICE

(71) Applicant: Kioxia Corporation, Tokyo (JP)

(72) Inventors: Katsuyoshi Komatsu, Yokkaichi Mie (JP); Hiroki Tokuhira, Kawasaki Kanagawa (JP); Hiroshi Takehira, Yokkaichi Mie (JP); Hiroyuki Ode, Yokkaichi Mie (JP); Jieqiong Zhang, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 253 days.

(21) Appl. No.: 17/901,485

(22) Filed: Sep. 1, 2022

(65) Prior Publication Data

US 2023/0301118 A1    Sep. 21, 2023

(30) Foreign Application Priority Data

Mar. 18, 2022   (JP) .................................. 2022-043670

(51) Int. Cl.
*H10B 63/00*     (2023.01)
*G11C 13/00*     (2006.01)
(Continued)

(52) U.S. Cl.
CPC ....... *H10B 63/845* (2023.02); *G11C 13/0004* (2013.01); *G11C 13/004* (2013.01);
(Continued)

(58) Field of Classification Search
CPC .............. G11C 13/0004; G11C 13/004; G11C 13/0069; G11C 2213/71; G11C 2213/72;
(Continued)

(56) References Cited

U.S. PATENT DOCUMENTS

2013/0240821 A1* 9/2013 Toh ...................... H10B 63/845
                                                       257/E45.001
2016/0268342 A1* 9/2016 Takashima ........... H10N 70/245
(Continued)

FOREIGN PATENT DOCUMENTS

JP         2012-244109 A      12/2012

OTHER PUBLICATIONS

Chen, H.Y., et al., "HfOx Based Vertical Resistive Random Access Memory for Cost-Effective 3D Cross-Point Architecture without Cell Selector," Department of Electrical Engineering and Center for Integrated Systems, Stanford University, Institute of Microelectronics, Peking University, IEDM 2012:497-500 (2012) (4 pages).
(Continued)

*Primary Examiner* — Uyen Smet
(74) *Attorney, Agent, or Firm* — Foley & Lardner LLP

(57) ABSTRACT

A semiconductor memory device includes a first wiring extending in a first direction; a second wiring extending in a second direction and spaced from the first wiring in a third direction; a stacked body disposed between the first and second wirings and including conductive layers and insulating layers alternately stacked on top of one another in the third direction; a columnar body extending through the stacked body and including: (a) an electrode disposed between the first wiring and the second wiring, (b) a memory layer disposed between the electrode and the conductive layers, and (c) a selection layer disposed between the electrode and the first wiring; and a diode disposed between the electrode and the second wiring.

16 Claims, 18 Drawing Sheets

(51) Int. Cl.
*H10N 70/00* (2023.01)
*H10N 70/20* (2023.01)

(52) U.S. Cl.
CPC ......... *G11C 13/0069* (2013.01); *H10B 63/20* (2023.02); *H10N 70/066* (2023.02); *H10N 70/231* (2023.02); *G11C 2213/71* (2013.01); *G11C 2213/72* (2013.01)

(58) Field of Classification Search
CPC ............ G11C 2213/15; G11C 13/0026; G11C 13/0028; G11C 13/003; H10B 63/20; H10B 63/24; H10N 70/066; H10N 70/231; H10N 70/20; H10N 70/823; H10N 70/882
See application file for complete search history.

(56) References Cited

U.S. PATENT DOCUMENTS

2019/0287979 A1* 9/2019 Hirayama .............. H10B 69/00
2020/0091236 A1* 3/2020 Hokazono ............. H10N 70/20

OTHER PUBLICATIONS

Laudato, M., et al., "ALD GeAsSeTe Ovonic Threshold Switch for 3D Stackable Crosspoint Memory," International Memory Workshop (IMW), 2020 IEEE (2020) (4 pages).

* cited by examiner

SEMICONDUCTOR MEMORY DEVICE

CROSS-REFERENCE TO RELATED APPLICATION

This application is based upon and claims the benefit of priority from Japanese Patent Application No. 2022-043670, filed Mar. 18, 2022, the entire contents of which are incorporated herein by reference.

FIELD

Embodiments described herein relate generally to a semiconductor memory device.

BACKGROUND

Some semiconductor memory devices may have a cross-point structure using a PCM (phase-change memory).

DETAILED DESCRIPTION

Figure 1:
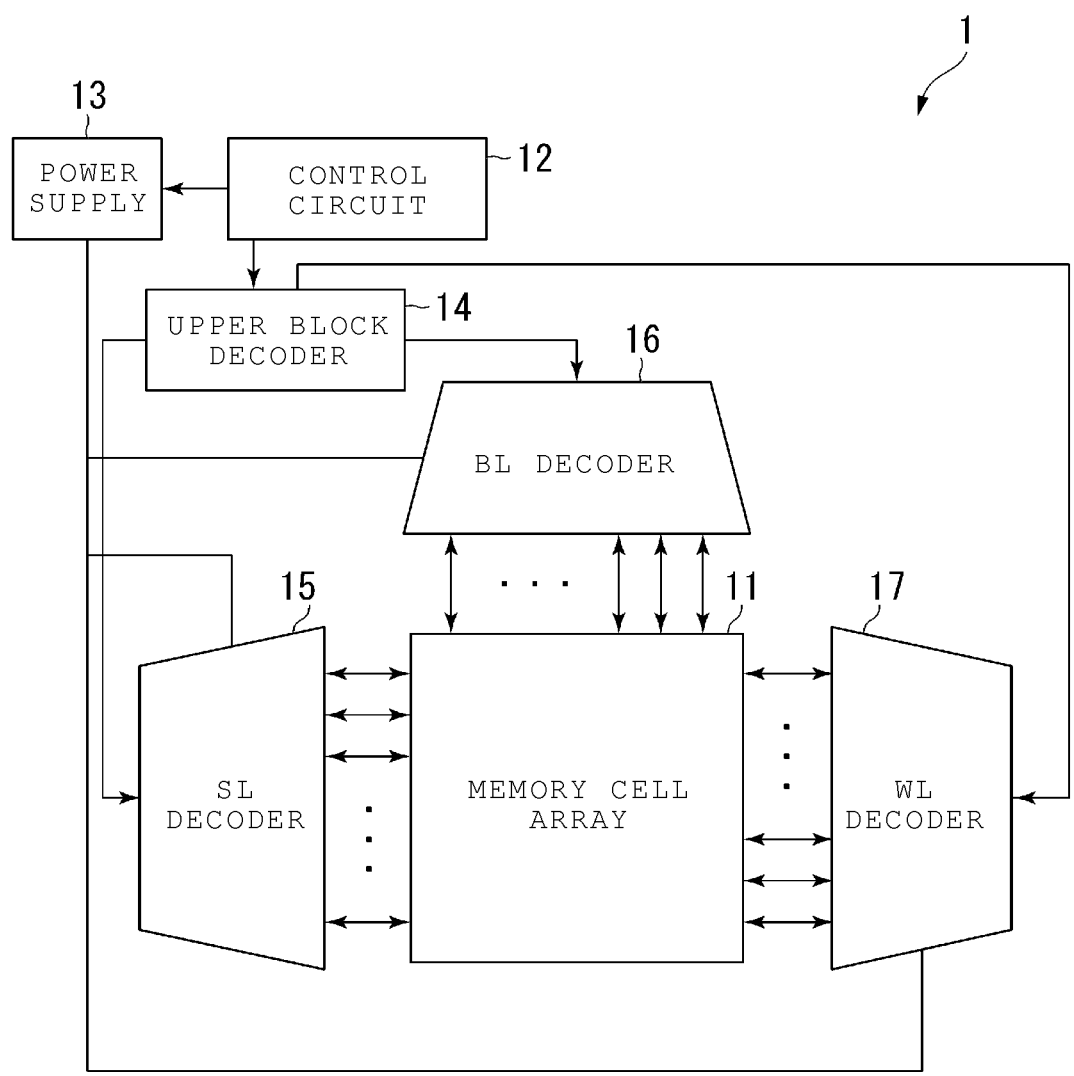
FIG. 1 is a block diagram showing a configuration of a semiconductor memory device of a first embodiment.

Embodiments provide a semiconductor memory device capable of improving a degree of integration.

In general, according to one embodiment, the semiconductor memory device includes a first wiring extending in a first direction; a second wiring extending in a second direction intersecting the first direction and spaced from the first wiring in a third direction intersecting the first direction and the second direction; a stacked body disposed between the first wiring and the second wiring and including a plurality of conductive layers and a plurality of insulating layers, wherein the plurality of conductive layers and the plurality of insulating layers are alternately stacked on top of one another in the third direction; a columnar body including: (a) an electrode disposed between the first wiring and the second wiring and extending in the third direction through the stacked body, (b) a memory layer disposed between the electrode and the plurality of conductive layers, and (c) a selection layer disposed between the electrode and the first wiring; and a diode disposed between the electrode and the second wiring.

Hereinafter, the semiconductor memory device of the embodiment will be described with reference to the drawings. In the following description, configurations having the same or similar functions are designated by the same reference numerals. Then, the duplicate descriptions of those configurations may be omitted. In the following description, components are designated by a reference numeral with a number or a letter at the end for distinction, but the number or the letter at the end may be omitted if distinction from each other is not necessary.

"Parallel", "orthogonal", or "same" may include cases of "substantially parallel", "substantially orthogonal", or "substantially the same", respectively. "Connection" is not limited to mechanical connections and may include electrical connections. That is, the "connection" is not limited to the case where a plurality of elements are directly connected and may include the case where the plurality of elements are connected with another element interposed therebetween. "Face" means that two members overlap when viewed in one direction, and may include the case where another member exists between the two members.

First, an X direction, a Y direction, and a Z direction will be defined. The X direction is a direction in which a bit line BL described later extends (see FIG. 2). The Y direction is a direction that intersects (for example, is orthogonal to) the X direction. The Y direction is a direction in which a source line SL described later extends (see FIG. 2). The Z direction is a direction that intersects (for example, is orthogonal to) the X direction and the Y direction. The Z direction is a stacking direction of a stacked body 20 described later (see FIG. 2). The X direction is an example of a "second direction". The Y direction is an example of a "first direction". The Z direction is an example of a "third direction". In the following description, a side on which the bit line BL is located with respect to the stacked body 20 may be referred to as "upper" and an opposite side thereof may be referred to as "lower". However, these expressions are for convenience only and do not specify a direction of gravity.

First Embodiment

<1. Configuration of Semiconductor Memory Device>

FIG. 1 is a block diagram showing a configuration of a semiconductor memory device 1. The semiconductor memory device 1 is, for example, a nonvolatile semiconductor memory device. The semiconductor memory device 1 is, for example, an OTP (One Time Programmable) memory that can be written only once, but is not limited thereto.

The semiconductor memory device 1 includes, for example, a memory cell array 11, a control circuit 12, a power supply 13, an upper block decoder 14, a source line decoder 15, a bit line decoder 16, and a word line decoder 17.

Figure 2:
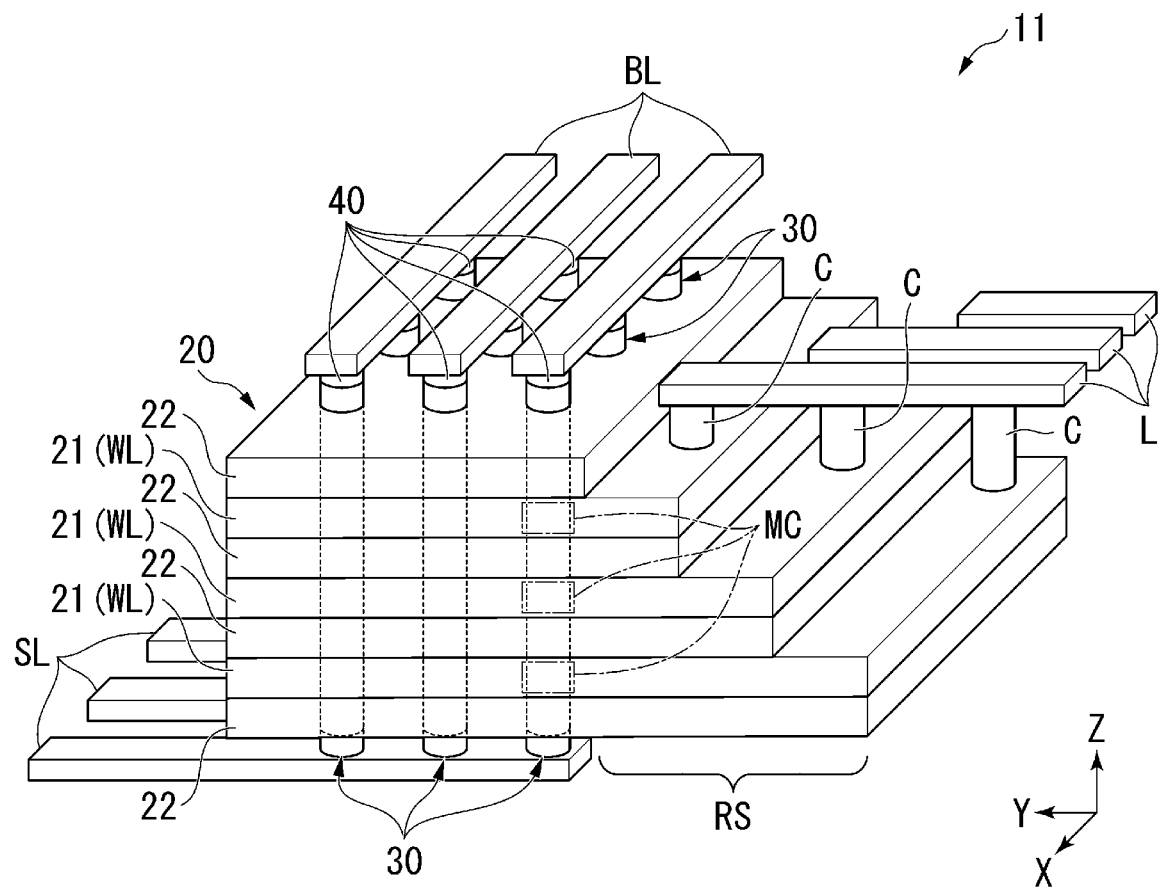
FIG. 2 is a perspective view showing a part of a memory cell array of the first embodiment.

The memory cell array 11 includes a plurality of memory cells MC, a plurality of source lines SL, a plurality of bit lines BL, and a plurality of word lines WL, and stores data in a nonvolatile manner (see FIG. 2). Each memory cell MC is associated with one source line SL, one bit line BL, and one word line WL. Details of the memory cell array 11 will be described later.

The control circuit 12 controls various operations of the semiconductor memory device 1. For example, the control circuit 12 controls a writing and a reading of data to and from the memory cell array 11 by controlling the source line decoder 15, the bit line decoder 16, and the word line decoder 17 via the upper block decoder 14.

The power supply 13 supplies electric power to each configuration in the semiconductor memory device 1 based on control of the control circuit 12. For example, the power supply 13 includes a plurality of step-down circuits such as a regulator that steps down a power supply voltage. Output terminals of the plurality of step-down circuits are connected to various voltage supply lines such as a voltage supply line for the selected source line, a voltage supply line for the non-selected source line, a voltage supply line for the selected bit line, a voltage supply line for the non-selected bit line, a voltage supply line for the selected word line, a voltage supply line for the non-selected word line, and the like.

Based on the control of the control circuit 12, the upper block decoder 14 sequentially decodes address data latched in an address register (not shown), outputs a source line address to the source line decoder 15, outputs a bit line address to the bit line decoder 16, and outputs a word line address to the word line decoder 17.

The source line decoder 15 electrically connects the source line specified by the source line address to the voltage supply line for the selected source line and electrically connects the other source lines to the voltage supply line for the non-selected source line. The bit line decoder 16 electrically connects the bit line specified by the bit line address to the voltage supply line for the selected bit line and electrically connects the other bit lines to the voltage supply line for the non-selection bit line. The word line decoder 17 electrically connects the word line specified by the word line address to the voltage supply line for the selected word line and electrically connects the other word lines to the voltage supply line for the non-selected word line.

<2. Memory Cell Array Configuration>

FIG. 2 is a perspective view showing a part of the memory cell array 11. In the FIG. 2, an insulating portion which is not related to the description is not illustrated. The memory cell array 11 includes, for example, the plurality of source lines SL, the plurality of bit lines BL, the stacked body 20, a plurality of columnar bodies 30, and a plurality of diodes 40.

The plurality of source lines SL are wirings provided in the memory cell array 11. The plurality of source lines SL are spaced apart from each other in the X direction. The plurality of source lines SL extend parallel to each other along the Y direction. The source line SL is formed of a conductive material such as tungsten. The source line SL is an example of the "first wiring".

The plurality of bit lines BL are wirings provided in the memory cell array 11. The plurality of bit lines BL are spaced apart from each other in the Y direction. The plurality of bit lines BL extend parallel to each other along the X direction. The plurality of bit lines BL are located apart from the plurality of source lines SL in the Z direction. The bit line BL is formed of the conductive material such as tungsten. The bit line BL is an example of the "second wiring".

The stacked body 20 is a stacked body for locating the word lines WL described later side by side in the Z direction. The stacked body 20 is disposed between the plurality of source lines SL and the plurality of bit lines BL. The stacked body 20 includes a plurality of conductive layers 21 and a plurality of insulating layers 22. The plurality of conductive layers 21 and the plurality of insulating layers 22 are alternately stacked one by one in the Z direction.

The conductive layer 21 is formed of the conductive material such as tungsten. The conductive layer 21 includes, for example, a main body portion 21a and a barrier metal layer 21b provided on a surface of the main body portion 21a (see FIG. 3). A thickness of the conductive layer 21 in the Z direction is, for example, 5 nm to 10 nm. Each conductive layer 21 functions as the word line WL. The word line WL is a wiring provided in the memory cell array 11.

The insulating layer 22 is an interlayer insulating film that insulates between two conductive layers 21 adjacent to each other in the Z direction. The insulating layer 22 is formed of an insulating material such as silicon oxide. A thickness of the insulating layer 22 in the Z direction is, for example, 10 nm to 20 nm.

Further, the stacked body 20 includes a staircase region RS in which lengths of the plurality of conductive layers 21 in the Y direction are different. In the staircase region RS, a staircase structure is formed by a plurality of conductive layers 21 having different lengths in the Y direction. In the staircase region RS, a contact electrode C is connected to an end portion of each conductive layer 21 by utilizing the staircase structure. Each contact electrode C extends upward in the Z direction from the end portion of the conductive layer 21. An upper wiring L is connected to each contact electrode C.

The plurality of columnar bodies 30 are columnar bodies for locating the plurality of memory cells MC side by side in the Z direction. The plurality of columnar bodies 30 are located in a matrix spaced apart in the X direction and the Y direction. When viewed from above in the Z direction, each columnar body 30 is located corresponding to an intersection of one source line SL and one bit line BL. Each columnar body 30 is located between the source line SL and the bit line BL and extends in the Z direction in the stacked body 20.

Figure 3:
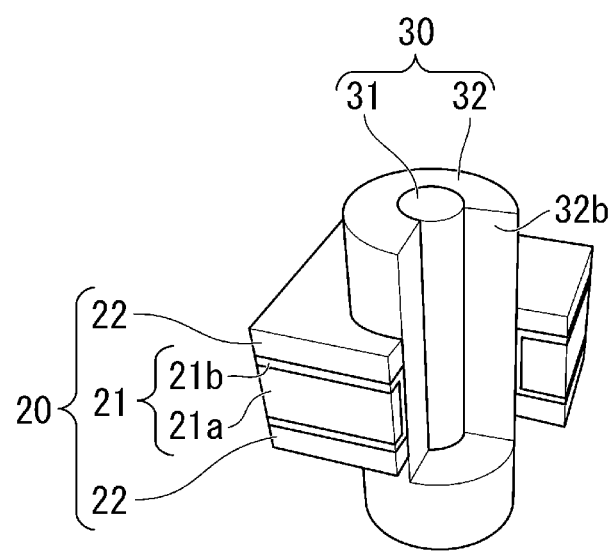
FIG. 3 is a perspective cross-sectional view showing a part of a columnar body and a stacked body of the first embodiment.

FIG. 3 is a perspective sectional view showing a part of the columnar body 30 and the stacked body 20. The columnar body 30 has, for example, a cylindrical shape. The columnar body 30 penetrates the conductive layers 21 and the insulating layers 22 in the stacked body 20 in the Z direction. The columnar body 30 has, for example, an electrode unit 31 and a selector film 32.

Figure 4:
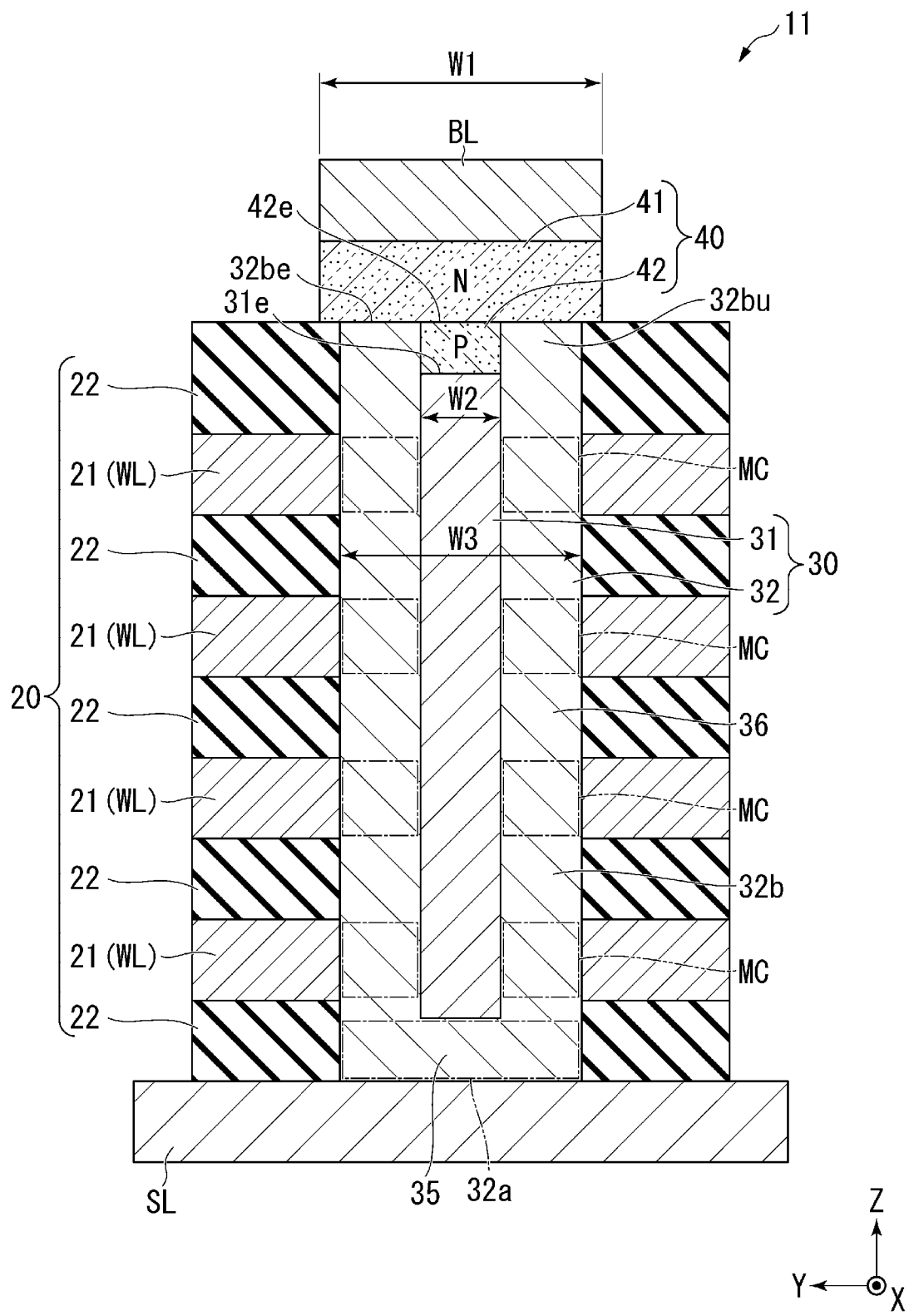
FIG. 4 is a cross-sectional view showing a part of the memory cell array of the first embodiment.

FIG. 4 is a cross-sectional view showing a part of the memory cell array 11.

The electrode unit 31 is, for example, a conductive cylinder along the Z direction. The electrode unit 31 is formed of the conductive material such as tungsten, titanium nitride, or titanium. A diameter of the electrode unit 31 is, for example, 10 nm or less. The electrode unit 31 is disposed between the source line SL and the bit line BL and extends in the Z direction in the stacked body 20. The electrode unit 31 extends from below a lowest conductive layer 21 in the plurality of conductive layers 21 to above an uppermost conductive layer 21 in the plurality of conductive layers 21. The electrode unit 31 is a wiring extending in the Z direction in the stacked body 20. The electrode unit 31 may be referred to as a vertical bit line (VBL).

The selector film 32 is a functional film formed along the electrode unit 31. The selector film 32 has a bottomed annular shape that covers a peripheral surface and a lower end of the electrode unit 31. The selector film 32 is an example of a "first film". The selector film 32 contains, for example, one or more chalcogenides of sulfur (S), selenium (Se), and tellurium (Te). The selector film 32 may contain, for example, one or more of germanium (Ge), arsenic (As), antimony (Sb), and silicon (Si) in addition to one or more chalcogenides of sulfur, selenium, and tellurium. In the present embodiment, the selector film 32 is formed by a composition of $Ge_{23}As_{38}Se_{15}Te_{24}$ or a composition in which tellurium is eliminated from the composition. However, a material of the selector film 32 is not limited to a specific material. A film thickness of the selector film 32 (a film thickness at a radius of the columnar body 30) is, for example, 5 nm to 10 nm.

The selector film 32 includes, for example, a selection layer 35 and a memory layer 36. That is, in the present embodiment, the selection layer 35 and the memory layer 36 are formed by the same film. The selection layer 35 and the memory layer 36 contain the same material and the same composition. The selection layer 35 and the memory layer 36 are formed continuously from each other.

The selection layer 35 is a 2-terminal switching element. The selection layer 35 is a portion of the selector film 32 disposed between the source line SL and the electrode unit 31. For example, the selector film 32 includes a bottom portion 32a located below the electrode unit 31. The selection layer 35 is formed by the bottom portion 32a of the selector film 32. The selection layer 35 is interposed between the source line SL and the electrode unit 31 in the Z direction and is in contact with the source line SL and the electrode unit 31, respectively.

The selection layer 35 functions as a selector capable of switching an electrical connection state between the source line SL and the electrode unit 31 between a conductive state and a non-conductive state. For example, the selection layer 35 is used as a selector without performing a forming, which will be described later. The selection layer 35 switches from the non-conductive state to the conductive state by applying a voltage equal to or higher than a first threshold voltage (threshold voltage Vth described later). That is, when a voltage equal to or higher than the first threshold voltage (threshold voltage Vth) is applied between the source line SL and the electrode unit 31, the selection layer 35 switches to the conductive state to electrically connect the source line SL and the electrode unit 31. On the other hand, when a voltage equal to or higher than the first threshold voltage (threshold voltage Vth) is not applied between the source line SL and the electrode unit 31, the selection layer 35 maintains the non-conductive state to electrically cut off the source line SL and the electrode unit 31.

The memory layer 36 extends in the Z direction in the selector film 32 and is a portion that forms the plurality of memory cells MC. The memory layer 36 is located between the electrode unit 31 and the plurality of conductive layers 21. For example, the selector film 32 has an annular portion 32b that surrounds the peripheral surface of the electrode unit 31 and extends in the Z direction. The memory layer 36 is formed by the annular portion 32b of the selector film 32. The memory layer 36 extends from below the lowest conductive layer 21 in the plurality of conductive layers 21 to above the uppermost conductive layer 21 in the plurality of conductive layers 21.

A portion of the memory layer 36 located between each conductive layer 21 and the electrode unit 31 functions as the memory cell MC. A state of the memory cell MC changes when a first predetermined voltage (a voltage equal to or higher than a write voltage Vw described later) is applied between the electrode unit 31 and the conductive layer 21. In the memory cell MC, by changing the above state, a threshold voltage for switching an electrical connection state between the electrode unit 31 and the conductive layer 21 between the conductive state and the non-conductive state is changed. The memory cell MC can store a data value depending on whether the threshold voltage is changed.

Figure 5:
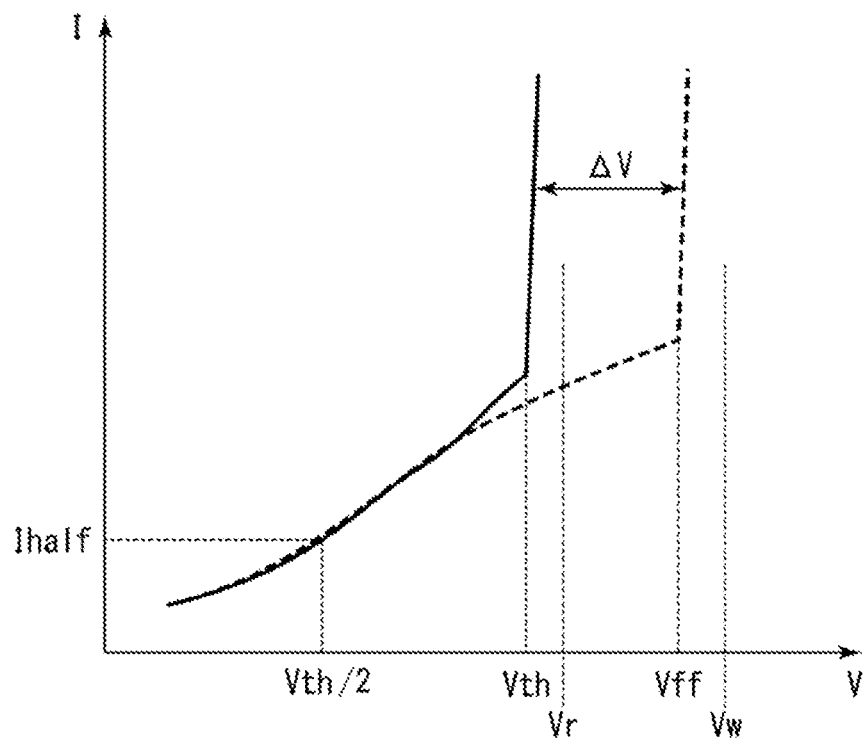
FIG. 5 is a diagram illustrating characteristics of the memory cell of the first embodiment.

FIG. 5 is a diagram illustrating characteristics of the memory cell MC. In the memory cell MC, when the forming is performed, a threshold voltage at which the non-conductive state is switched to the conductive state is changed. For example, in a first state before the write voltage Vw is applied (before forming), in the memory cell MC, the non-conductive state is switched to the conductive state when a voltage equal to or higher than the first threshold voltage Vth is applied. On the other hand, in a second state after the write voltage Vw is applied (after forming), in the memory cell MC, the non-conductive state is switched to the conductive state when a voltage equal to or higher than a second threshold voltage Vff, which is higher than the first threshold voltage Vth, is applied. As a result, the memory cell MC can store a 1-bit data value depending on presence or absence of the writing (whether the forming is performed).

In the memory cell MC using the selector film 32 of the present embodiment, a change ΔV(Vff−Vth) of the threshold voltage is sufficiently large. Therefore, a read error is unlikely to occur when a read voltage Vr for confirming the presence or absence of the writing in the memory cell MC is applied. Further, in the memory cell MC using the selector film 32, a current Ihalf that flows when a voltage (Vth/2) that is half of the first threshold voltage Vth is applied is small. Therefore, it is possible to reduce a sneak current. In the following, the memory cell MC in which the forming is performed may be referred to as a "memory cell MC in which the writing is performed". Further, the memory cell MC in which the forming is not performed may be referred to as a "memory cell MC in which the writing is not performed".

Figure 6:
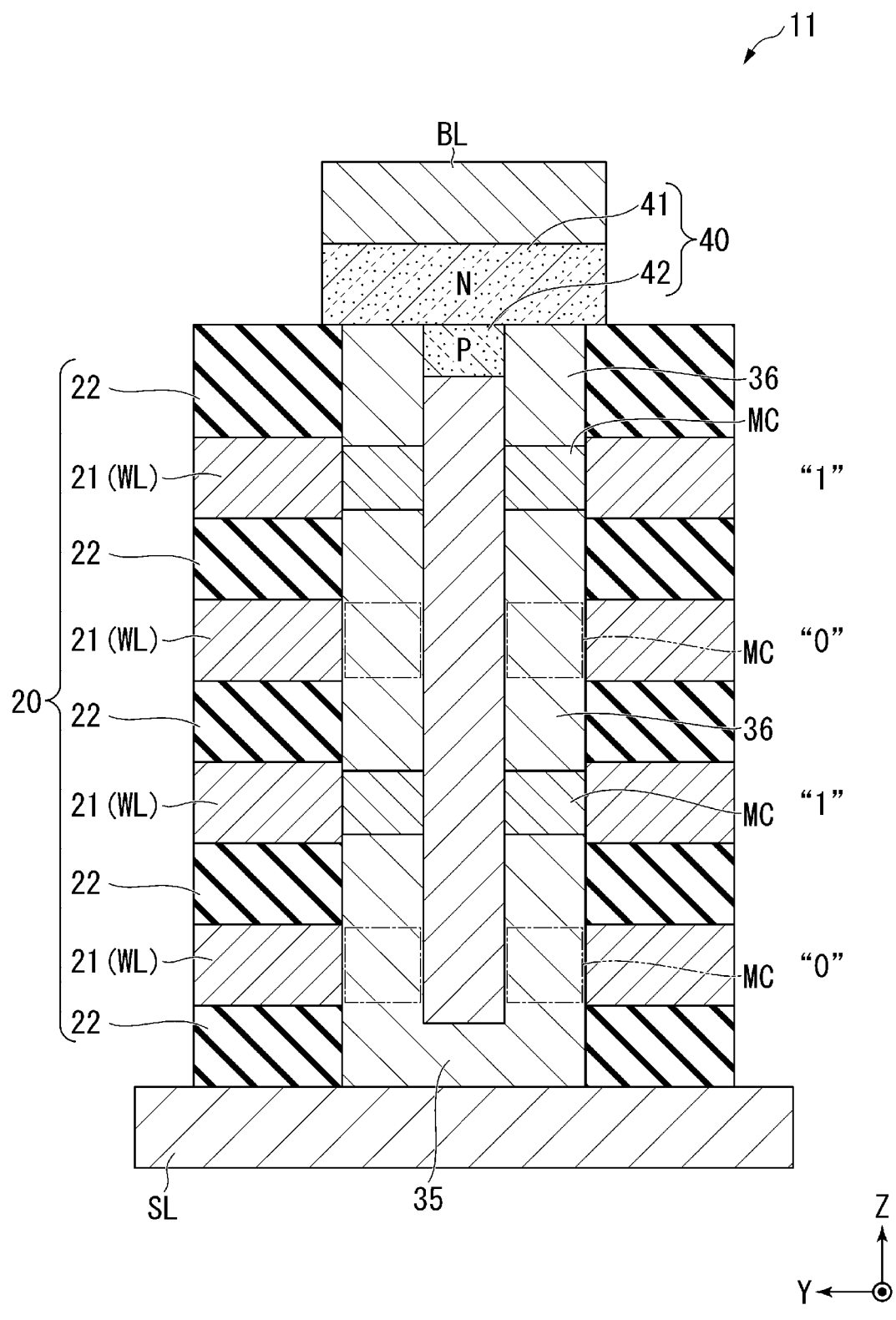
FIG. 6 is a cross-sectional view showing a part of a memory cell array including a memory cell in which writing of the first embodiment is performed.

FIG. 6 is a cross-sectional view showing a part of the memory cell array 11 including the memory cell MC in which the writing is performed. In the memory cell MC in which the writing is not performed, when a read voltage Vr higher than the first threshold voltage Vth is applied between the electrode unit 31 and the conductive layer 21, a current between the electrode unit 31 and the conductive layer 21 is allowed to flow. In this case, the control circuit 12 determines that a data value "1" is stored in the memory cell MC by detecting a current flowing through the conductive layer 21.

On the other hand, in the memory cell MC in which the write forming is performed, even if the read voltage Vr is applied between the electrode unit 31 and the conductive layer 21, no current flows between the electrode unit 31 and the conductive layer 21. In this case, the control circuit 12 determines that a data value "0" is stored in the memory cell MC by not detecting the current flowing through the conductive layer 21. That is, the control circuit 12 can read out the data value to be stored in each memory cell MC by performing detection related to the current flowing through the conductive layer 21 corresponding to each memory cell MC.

Next, referring back to FIGS. 2 and 4, the diode 40 will be described.

As shown in FIG. 2, the plurality of diodes 40 are located corresponding to the plurality of columnar bodies 30 when viewed from above in the Z direction. The diode 40 is disposed between the columnar body 30 and the bit line BL. In the present embodiment, the diode 40 is interposed between the columnar body 30 and the bit line BL in the Z direction, and is in contact with the columnar body 30 and the bit line BL, respectively.

As shown in FIG. 4, the diode 40 is disposed between the electrode unit 31 of the columnar body 30 and the bit line BL. In the present embodiment, an anode of each diode 40 is connected to the electrode unit 31 of the columnar body 30. A cathode of each diode 40 is connected to the bit line BL. Therefore, each diode 40 allows a current to pass from the electrode unit 31 toward the bit line BL but does not allow a current to pass from the bit line BL toward the electrode unit 31. The diode 40 prevents a current passing through the electrode unit 31 of one columnar body 30 from flowing into the electrode unit 31 of another columnar body 30 via the bit line BL.

In the present embodiment, the diode 40 includes a first semiconductor unit 41 and a second semiconductor unit 42. The first semiconductor unit 41 has a first polarity. The first semiconductor unit 41 includes, for example, an N-type semiconductor. Meanwhile, the second semiconductor unit 42 has a polarity different from the first polarity. The second semiconductor unit 42 includes, for example, a P-type semiconductor. The N-type semiconductor is formed of polysilicon (poly-Si) containing impurities of pentavalent elements such as phosphorus (P) or arsenic (As). Alternatively, the N-type semiconductor may be formed of amorphous IGZO (a-IGZO), titanium oxide ($TiO_2$), tungsten oxide (WO), or the like. Meanwhile, the P-type semiconductor is formed of polysilicon (poly-Si) containing impurities of trivalent elements such as boron (B) and indium (In). Alternatively, the P-type semiconductor may be formed of copper oxide (CuO), nickel oxide (NiO), or the like. The diode 40 is not limited to a PN junction type diode and may be a Schottky diode.

In the present embodiment, an upper end 31e of the electrode unit 31 is located below an upper end 32be of the annular portion 32b of the selector film 32. In the present embodiment, the second semiconductor unit 42 of the diode 40 is disposed in an upper end portion 32bu of the annular portion 32b of the selector film 32. The upper end portion 32bu of the annular portion 32b is, for example, a portion located above the upper end 31e of the electrode unit 31. An upper end 42e of the second semiconductor unit 42 and the upper end 32be of the annular portion 32b of the selector film 32 are located at the same height, for example.

Meanwhile, the first semiconductor unit 41 is disposed between the second semiconductor unit 42 and the bit line BL. The first semiconductor unit 41 faces the selector film 32 of the columnar body 30 and the second semiconductor unit 42 in the Z direction. For example, a width W1 of the first semiconductor unit 41 in the Y direction is larger than a width W2 of the second semiconductor unit 42 in the Y direction. For example, the width W1 of the first semiconductor unit 41 in the Y direction is larger than a width W3 of the columnar body 30 in the Y direction.

Figure 7:
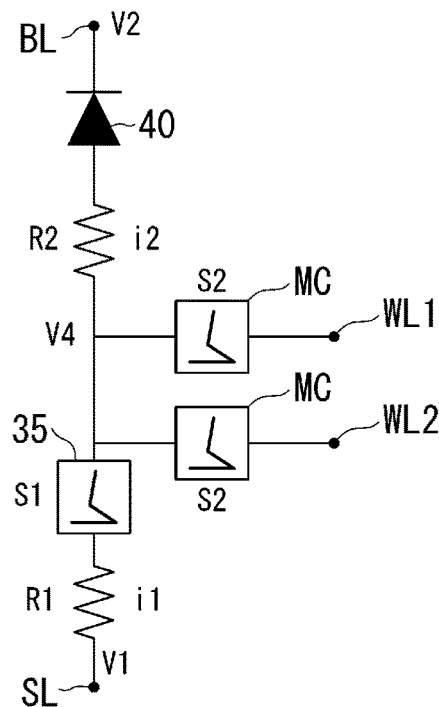
FIG. 7 is an equivalent circuit diagram corresponding to a configuration related to one columnar body of the first embodiment.

FIG. 7 is an equivalent circuit diagram corresponding to a configuration related to one columnar body 30 described above. In the drawings after FIG. 7, for convenience of explanation, two memory cells MC in one columnar body 30 are extracted and shown. Each symbol in the drawing means as follows. "V1" indicates a voltage applied to the source line SL. "R1" indicates an internal resistance of the source line SL. "i1" indicates a current flowing through the source line SL. "S1" indicates the selection layer 35. "S2" indicates the memory cell MC. "V4" indicates a voltage applied to the electrode unit 31. "R2" indicates an internal resistance of the electrode unit 31. "i2" indicates a current flowing through the electrode unit 31. "V2" indicates a voltage applied to the bit line BL. "V3" indicates a voltage applied to the first word line WL1. "V5" indicates a voltage applied to the second word line WL2. In the following description, for the sake of clarity, "R2" is treated as being negligibly small, and a voltage drop caused by "R2" is set to zero. The same applies when a prime ('), a double prime ("), or a triple prime ("') is attached to each symbol.

<3. Operation>
<3.1 Write Operation>

Next, a write operation for the memory cell MC will be described. In the following, a memory cell MC to be written (memory cell MC to perform the forming) is referred to as "selected memory cell MCS", and a memory cell MC not to be written is referred to as "non-selected memory cell MCN". The source line SL, the bit line BL, and the word line WL corresponding to the selected memory cell MCS is applied with voltages from the voltage supply line for the selected source line, the voltage supply line for the selected bit line, and the voltage supply line for the selected word line, respectively. The other source lines SL, bit lines BL, and word lines WL are applied with voltages from the voltage supply line for the non-selected source line, the voltage supply line for the non-selective bit line, and the voltage supply line for the non-selective word line, respectively.

In the present embodiment, when the write operation to the selected memory cell MCS is performed, the control circuit 12 controls voltage states of the source line SL, the bit line BL, and the word line WL so that the first predetermined voltage (write voltage Vw) is applied between the electrode unit 31 of the columnar body 30 including the selected memory cell MCS and the word line WL connected to the selected memory cell MCS. The write voltage Vw is, for example, a voltage equal to or higher than a threshold voltage Vff required for forming. In the following, for convenience of explanation, some combinations of the two columnar bodies 30 in the memory cell array 11 will be extracted, and the write operation in each combination will be described in detail.

(Write Operation Related to First Combination)

Figure 8A:
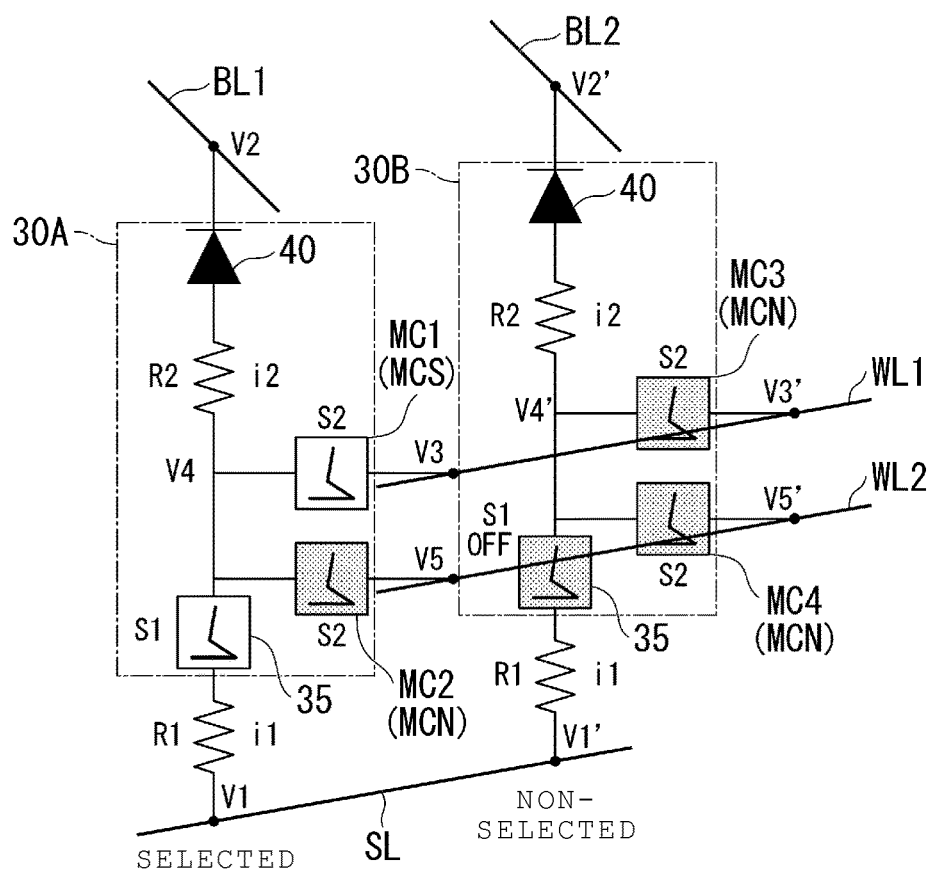
FIG. 8A is a diagram illustrating a write operation related to a first combination of the first embodiment.
Figure 8B:
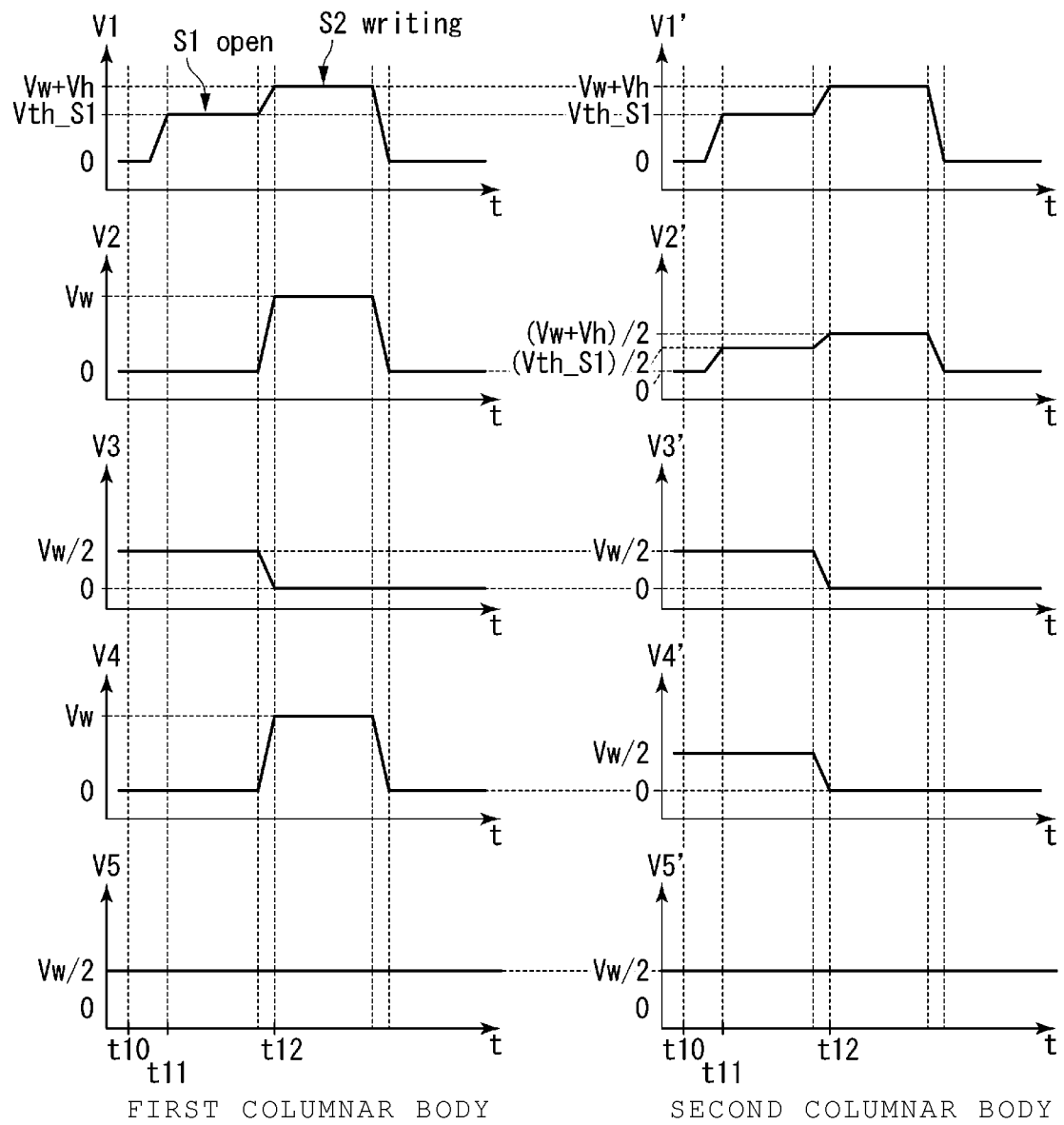
FIG. 8B is a diagram illustrating the write operation related to the first combination of the first embodiment.

FIGS. 8A and 8B are diagrams illustrating a write operation related to a first combination. The first combination is an example in which a common source line SL is connected to two columnar bodies 30.

As shown in FIG. 8A, the first combination includes a first columnar body 30A including the selected memory cell MCS and a second columnar body 30B not including the selected memory cell MCS. The first columnar body 30A includes a first memory cell MC1 which is the selected memory cell MCS and a second memory cell MC2 which is the non-selected memory cell. The second columnar body 30B includes a third memory cell MC3 and a fourth memory cell MC4, each of which is the non-selected memory cell MCN. The common source line SL is connected to the first columnar body 30A and the second columnar body 30B. A first bit line BL1 is connected to the first columnar body 30A. A second bit line BL2 is connected to the second columnar body 30B. A common first word line WL1 is connected to the first memory cell MC1 and the third memory cell MC3. A common second word line WL2 is connected to the second memory cell MC2 and the fourth memory cell MC4.

Further, as preconditions, the write voltage is "Vw", a maintenance voltage for maintaining the selection layer 35 in the conductive state is "Vh", and a threshold voltage of the selection layer 35 before forming is "Vth". Then, it is assumed that (Vw+Vh)/2<Vth is established. This precondition is common to all configurations described below.

With reference to FIG. 8B, a voltage control during the write operation related to the first combination will be described. First, at a time point t10 before the write operation is started, a predetermined voltage (Vw/2), which is half of the write voltage Vw, is applied to the first word line WL1 and the second word line WL2.

When the write operation is started, a predetermined voltage Vth_S1 for making the selection layer 35 in a conductive state is applied to the source line SL at a time point t11. The predetermined voltage Vth_S1 is a voltage equal to or higher than the first threshold voltage Vth. At the time point t11, the voltage applied to the first bit line BL1 is controlled to 0V. As a result, the predetermined voltage Vth_S1 is applied to the selection layer 35 of the first columnar body 30A, and the selection layer 35 of the first columnar body 30A is switched to the conductive state.

Meanwhile, at the time point t11, a voltage (Vth_S1/2), which is half of the predetermined voltage Vth_S1, is applied to the second bit line BL2. Therefore, a voltage equal to or higher than the first threshold voltage Vth is not applied to the selection layer 35 of the second columnar body 30B. As a result, the selection layer 35 of the second columnar body 30B maintains the non-conductive state.

Next, at a time point t12, a predetermined voltage (Vw+Vh), which is a sum of the write voltage Vw and the maintenance voltage Vh, is applied to the source line SL. At the time point t12, the write voltage Vw is applied to the first bit line BL1. At the time point t12, the voltage applied to the first word line WL1 is controlled to 0V. As a result, a write voltage Vw (V4−V3) is applied to the first memory cell MC1, and the first memory cell MC1 is written.

Meanwhile, at the time point t12, the predetermined voltage (Vw/2) is applied to the second word line WL2. Therefore, a voltage equal to or higher than the first threshold voltage Vth is not applied to the second memory cell MC2. As a result, the second memory cell MC2 is not written.

Further, at the time point t12, a predetermined voltage ((Vw+Vh)/2), which is half of the predetermined voltage (Vw+Vh), is applied to the second bit line BL2. Therefore, a voltage equal to or higher than the first threshold voltage Vth is not applied to the selection layer 35 of the second columnar body 30B. As a result, the selection layer 35 of the second columnar body 30B maintains the non-conductive state. Therefore, a voltage V4' maintains a potential equal to or lower than a voltage V2' in which the diode 40 becomes a forward bias, and the third memory cell MC3 and the fourth memory cell MC4 are not written.

In FIG. 8B, the voltage V4' at the time point t12 is shown as 0V, but in reality, the electrode unit 31 of the second columnar body 30B is in a floating state insulated from the whole wirings, so that a potential is indefinite. For example, when the number of stacked layers of the stacked bodies 20 increases, the voltage V4' at the time point t12 is affected by a voltage V5' applied to the second word line WL2 and becomes a potential near the predetermined voltage (Vw/2). This also applies to a voltage V4''' and a voltage V4'''' in the description of FIGS. 9B and 10B described later.

By the above operation, only the first memory cell MC1, which is the selected memory cell MCS, is written.

(Write Operation Related to Second Combination)

Figure 9A:
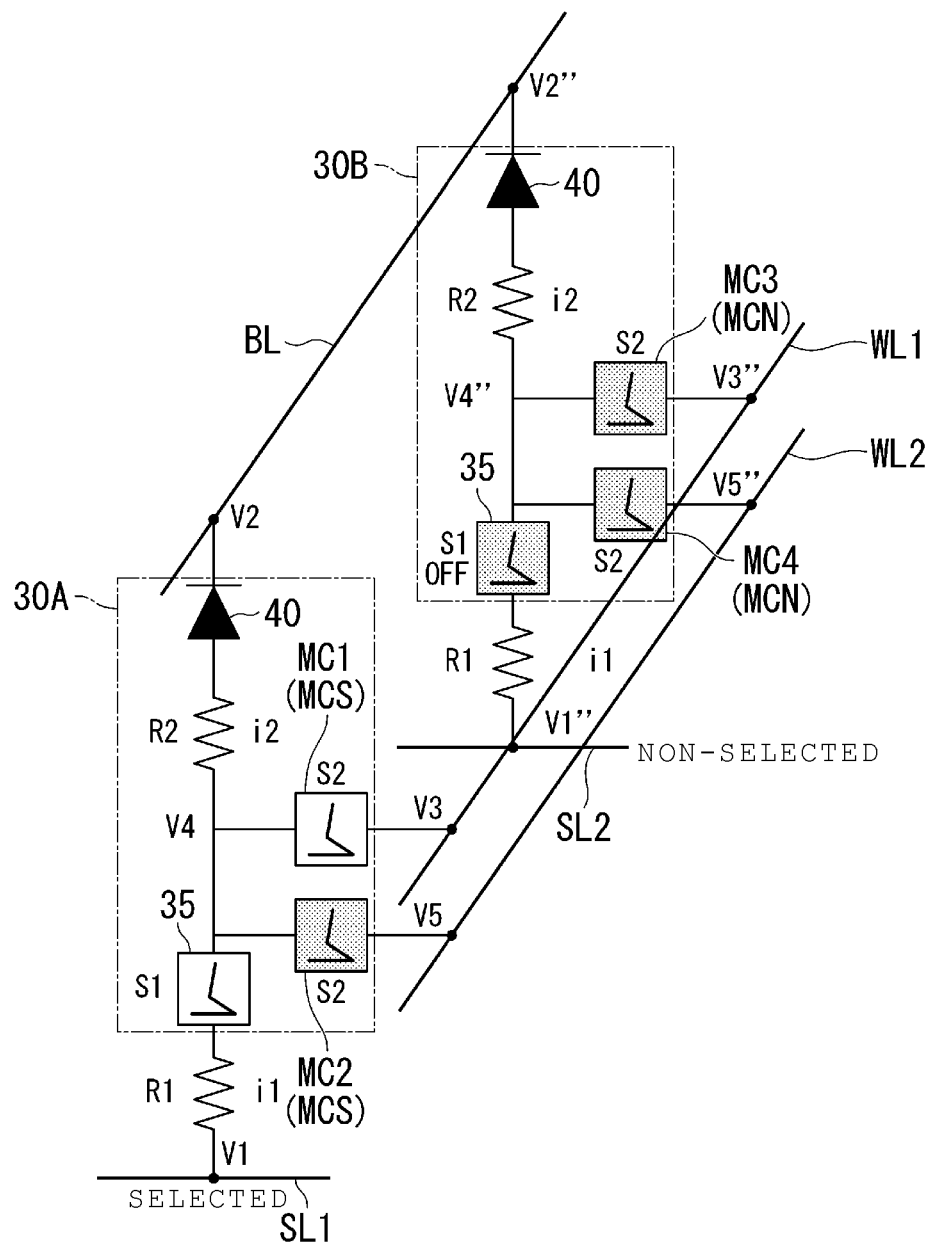
FIG. 9A is a diagram illustrating a write operation related to a second combination of the first embodiment.
Figure 9B:
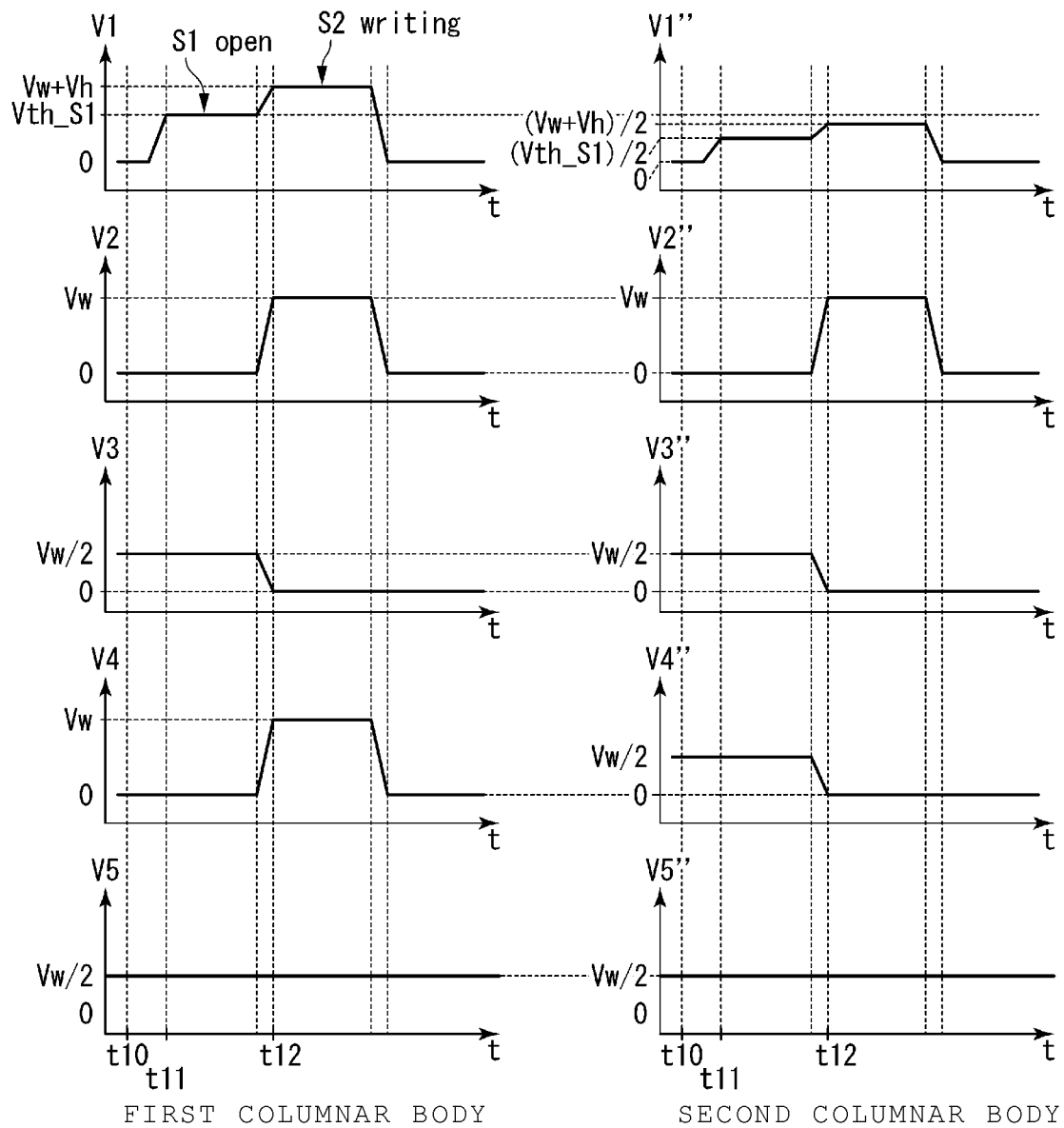
FIG. 9B is a diagram illustrating the write operation related to the second combination of the first embodiment.

FIGS. 9A and 9B are diagrams illustrating a write operation related to a second combination. The second combination is an example in which a common bit line BL is connected to two columnar bodies 30.

As shown in FIG. 9A, in the second combination, a first source line SL1 is connected to the first columnar body 30A. A second source line SL2 is connected to the second columnar body 30B. The common bit line BL is connected to the first columnar body 30A and the second columnar body 30B. Other configurations are the same as the first combination.

With reference to FIG. 9B, a voltage control during the write operation related to the second combination will be described. First, at the time point t10 before the write operation is started, the predetermined voltage (Vw/2), which is half of the write voltage Vw, is applied to the first word line WL1 and the second word line WL2.

When the write operation is started, the predetermined voltage Vth_S1 is applied to the first source line SL1 at a time point t11. At the time point t11, the voltage applied to the bit line BL is controlled to 0V. As a result, the predetermined voltage Vth_S1 is applied to the selection layer 35 of the first columnar body 30A, and the selection layer 35 of the first columnar body 30A is switched to the conductive state.

Meanwhile, at the time point t11, the voltage (Vth_S1/2), which is half of the predetermined voltage Vth_S1, is applied to the second source line SL2. Therefore, a voltage equal to or higher than the first threshold voltage Vth is not applied to the selection layer 35 of the second columnar body 30B. As a result, the selection layer 35 of the second columnar body 30B maintains a non-conductive state.

Next, at a time point t12, the predetermined voltage (Vw+Vh) is applied to the first source line SL1. At the time point t12, the write voltage Vw is applied to the bit line BL. At the time point t12, the voltage applied to the first word line WL1 is controlled to 0V. As a result, the write voltage Vw (V4−V3) is applied to the first memory cell MC1 and the first memory cell MC1 is written.

Meanwhile, at the time point t12, the predetermined voltage (Vw/2) is applied to the second word line WL2. Therefore, a voltage equal to or higher than the first threshold voltage Vth is not applied to the second memory cell MC2. As a result, the second memory cell MC2 is not written.

Further, at the time point t12, the predetermined voltage ((Vw+Vh)/2), which is half of the predetermined voltage (Vw+Vh), is applied to the second source line SL2. Therefore, a voltage equal to or higher than the first threshold voltage Vth is not applied to the selection layer 35 of the second columnar body 30B. As a result, the selection layer 35 of the second columnar body 30B is maintained in the non-conductive state. Further, since a voltage V2" at the time point t12 is the highest potential among the potentials applied to the second columnar body 30B, the diode 40 immediately below becomes a reverse bias. When a reverse bias resistance of the diode 40 is sufficiently higher than resistances of the third memory cell MC3, the fourth memory cell MC4, and the selection layer 35 of the second columnar body 30B, the voltage V4" is maintained at an intermediate potential among a voltage V1", a voltage V3", and a voltage V5". Therefore, a potential difference between the voltage V4" and the voltage V3" and a potential difference between the voltage V4" and the voltage V5" are maintained at the predetermined voltage ((Vw+Vh)/2) or less. Therefore, the third memory cell MC3 and the fourth memory cell MC4 are not written. By the above operation, only the first memory cell MC1, which is the selected memory cell MCS, is written.

(Write Operation Related to Third Combination)

Figure 10A:
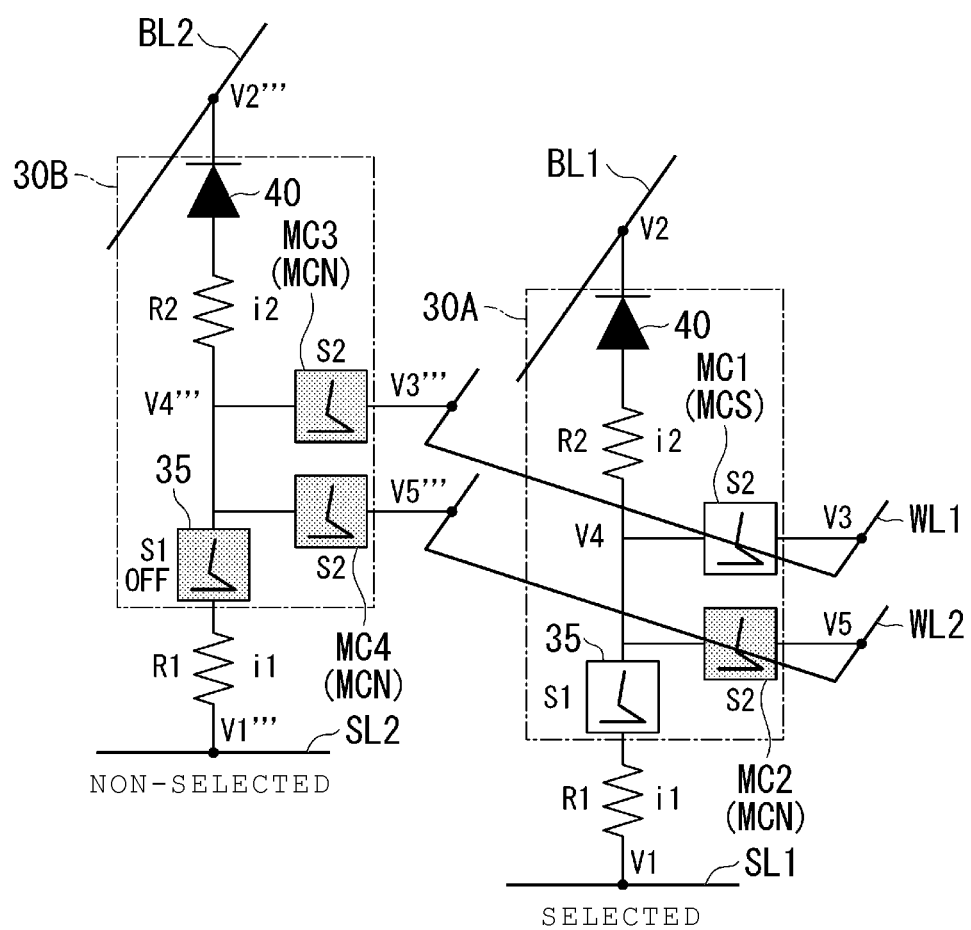
FIG. 10A is a diagram illustrating a write operation related to a third combination of the first embodiment.
Figure 10B:
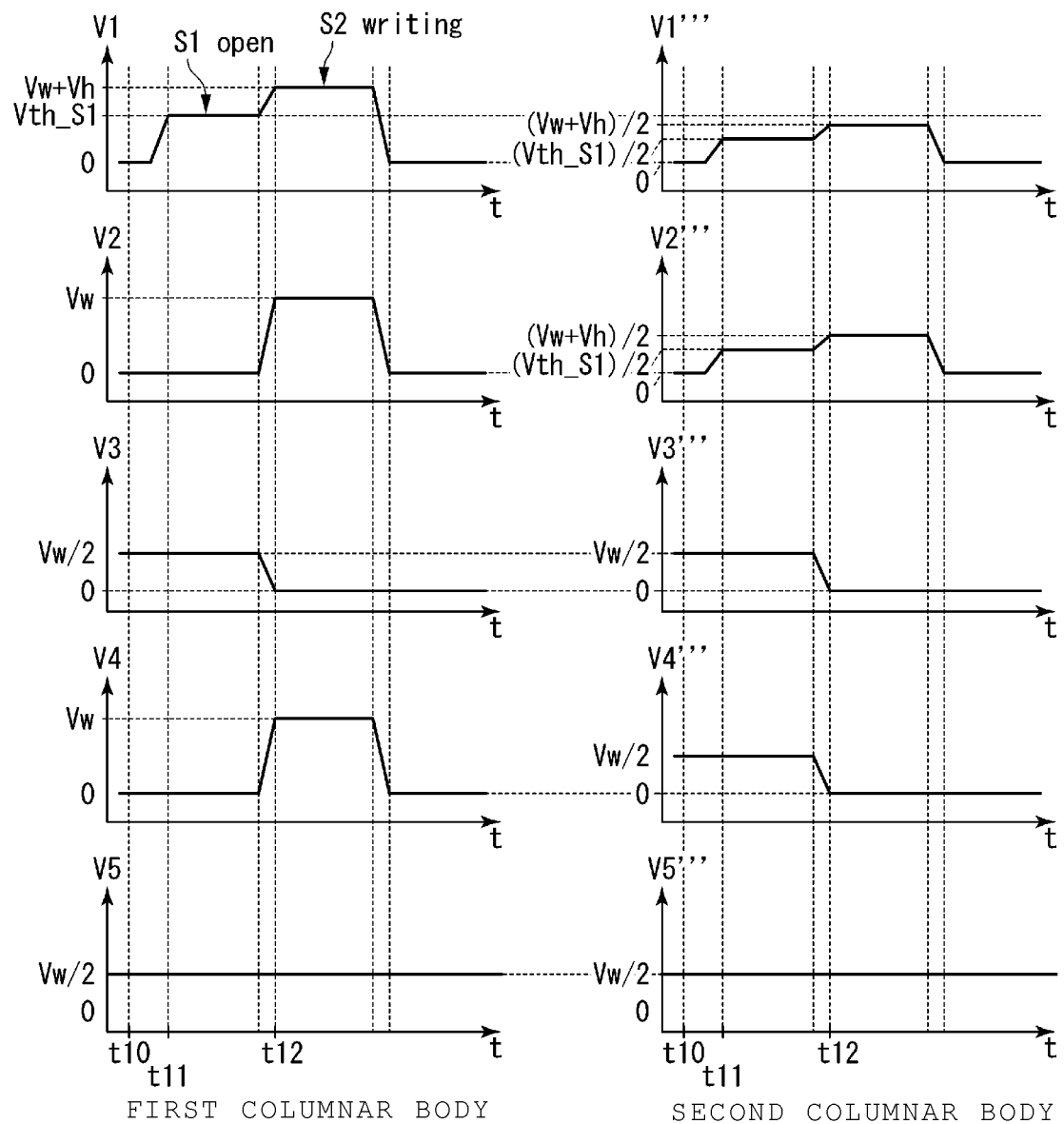
FIG. 10B is a diagram illustrating the write operation related to the third combination of the first embodiment.

FIGS. 10A and 10B are diagrams illustrating a write operation related to a third combination. The third combination is an example in which the source lines SL connected to two columnar bodies 30 are not common, and the bit lines BL connected to two columnar bodies 30 are also not common.

As shown in FIG. 10A, in the third combination, the first source line SL1 is connected to the first columnar body 30A. The second source line SL2 is connected to the second columnar body 30B. The first bit line BL1 is connected to the first columnar body 30A. The second bit line BL2 is connected to the second columnar body 30B. Other configurations are the same as the first combination.

With reference to FIG. 10B, a voltage control during the write operation related to the third combination will be described. First, at the time point t10 before the write operation is started, the predetermined voltage (Vw/2), which is half of the write voltage Vw, is applied to the first word line WL1 and the second word line WL2.

When the write operation is started, first, at the time point t11, the predetermined voltage Vth_S1 for making the selection layer 35 in the conductive state is applied to the first source line SL1. At the time point t11, the voltage applied to the first bit line BL1 is controlled to 0V. As a result, the predetermined voltage Vth_S1 is applied to the selection layer 35 of the first columnar body 30A and the selection layer 35 of the first columnar body 30A is switched to the conductive state.

Meanwhile, at the time point t11, the voltage (Vth_S1/2), which is half of the predetermined voltage Vth_S1, is applied to the second source line SL2 and the second bit line BL2. Therefore, a voltage equal to or higher than the first threshold voltage Vth is not applied to the selection layer 35 of the second columnar body 30B. As a result, the selection layer 35 of the second columnar body 30B maintains the non-conductive state.

Next, at the time point t12, the predetermined voltage (Vw+Vh) is applied to the first source line SL1. At the time point t12, the write voltage Vw is applied to the first bit line BL1. At the time point t12, the voltage applied to the first word line WL1 is controlled to 0V. As a result, the write voltage Vw (V4−V3) is applied to the first memory cell MC1, and the first memory cell MC1 is written.

Meanwhile, at the time point t12, the predetermined voltage (Vw/2) continues to be applied to the second word line WL2. Therefore, a voltage equal to or higher than the first threshold voltage Vth is not applied to the second memory cell MC2. As a result, the second memory cell MC2 is not written.

Further, at the time point t12, the predetermined voltage ((Vw+Vh)/2), which is half of the predetermined voltage (Vw+Vh), is applied to the second source line SL2 and the second bit line BL2. Therefore, a voltage equal to or higher than the first threshold voltage Vth is not applied to the selection layer 35 of the second columnar body 30B. As a result, the selection layer 35 of the second columnar body 30B maintains the non-conductive state. Therefore, the voltage V4''' maintains a potential equal to or lower than a voltage V2''' in which the diode 40 becomes the forward bias, and the third memory cell MC3 and the fourth memory cell MC4 are not written. By the above operation, only the first memory cell MC1, which is the selected memory cell MCS, is written.

<3.2 Read Operation>

Next, a read operation for the memory cell MC will be described.

In the present embodiment, when the read operation for the memory cell MC is performed, the control circuit 12 controls the voltage states of the source line SL and the bit line BL so that a second predetermined voltage (read voltage Vr) is applied between the electrode unit 31 of the columnar body 30 including the memory cell MC and the word line WL connected to the memory cell MC, thereby performing detection related to a current flowing through the word line WL. In the present application, "detection related to a current" is not limited to detecting the current itself, and may include, for example, detecting the voltage state generated in the word line WL. In the following, as in the description of the write operation, some combinations of two columnar bodies 30 in the memory cell array 11 will be extracted and the read operation in each combination will be described in detail.

(Read operation Related to First Combination)

Figure 11:
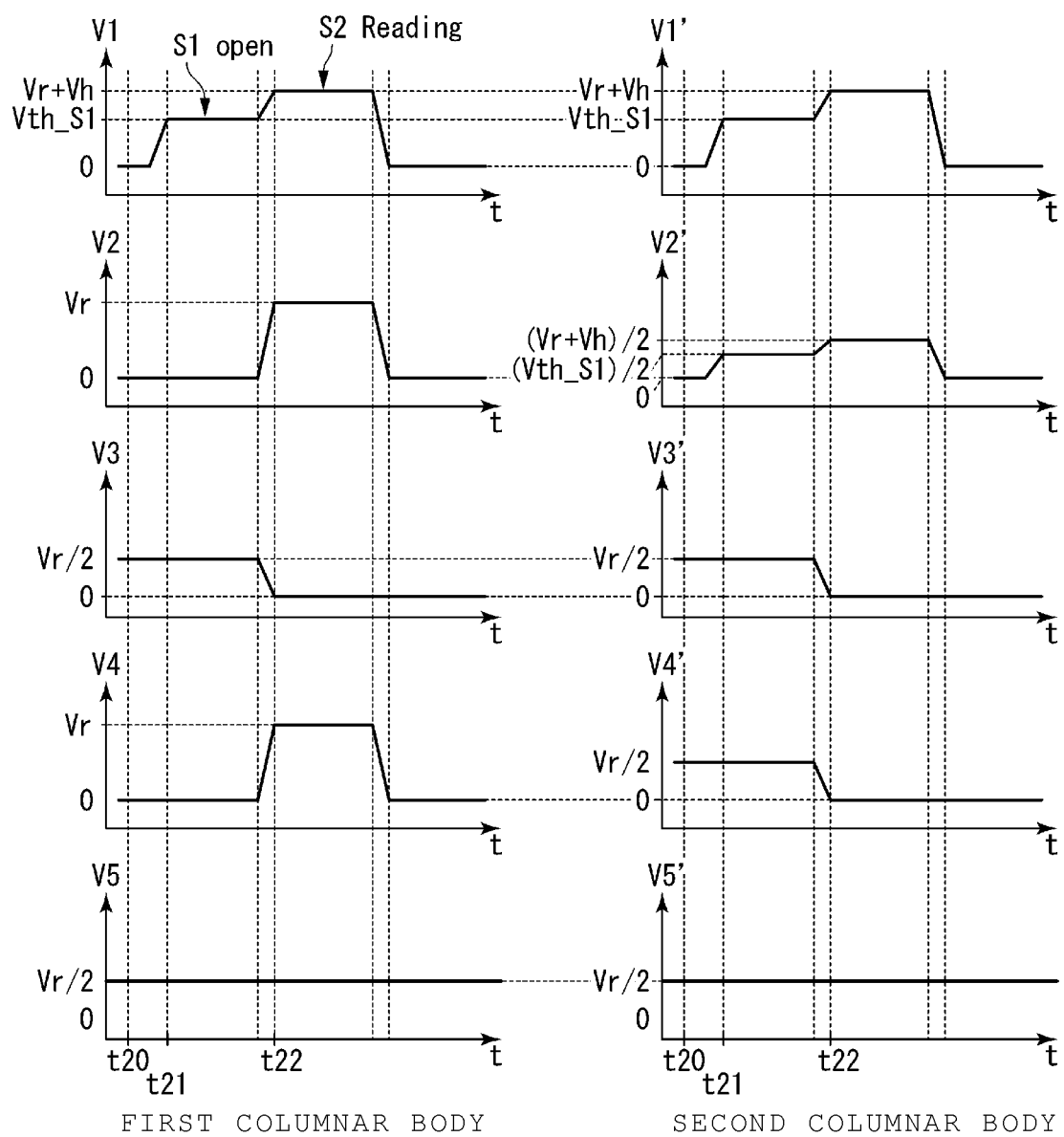
FIG. 11 is a diagram illustrating a read operation related to the first combination of the first embodiment.

FIG. 11 is a diagram illustrating a read operation related to the first combination. Here, a read operation related to the first memory cell MC1 of the first columnar body 30A will be described.

As shown in FIG. 11, at a time point t20 before the read operation is started, a predetermined voltage (Vr/2), which is half of the read voltage Vr, is applied to the first word line WL1 and the second word line WL2.

When the read operation is started, the predetermined voltage Vth_S1 for making the selection layer 35 in the conductive state is applied to the source line SL at a time point t21. At the time point t21, the voltage applied to the first bit line BL1 is controlled to 0V. As a result, the predetermined voltage Vth_S1 is applied to the selection layer 35 of the first columnar body 30A, and the selection layer 35 of the first columnar body 30A is switched to the conductive state.

Meanwhile, at the time point t21, the voltage (Vth_S1/2), which is half of the predetermined voltage Vth_S1, is applied to the second bit line BL2. Therefore, a voltage equal to or higher than the first threshold voltage Vth is not applied to the selection layer 35 of the second columnar body 30B. As a result, the selection layer 35 of the second columnar body 30B maintains a non-conductive state.

Next, at a time point t22, a predetermined voltage (Vr+Vh), which is a sum of the read voltage Vr and the maintenance voltage Vh, is applied to the source line SL. At the time point t22, the read voltage Vr is applied to the first bit line BL1. As a result, the read voltage Vr is applied to the first memory cell MC1. Here, when the first memory cell MC1 is being written, the first memory cell MC1 has a threshold voltage Vff higher than the read voltage Vr. Therefore, the first memory cell MC1 does not change to the conductive state. As a result, no current flows to the first word line WL1 through the first memory cell MC1.

At the time point t22, a predetermined voltage ((Vr+Vh)/2), which is half of the predetermined voltage (Vr+Vh), is applied to the second bit line BL2. Therefore, a voltage equal to or higher than the first threshold voltage Vth is not applied to the selection layer 35 of the second columnar body 30B. As a result, the selection layer 35 of the second columnar body 30B maintains the non-conductive state, and the third memory cell MC3 maintains the non-conductive state. Therefore, no current flows to the first word line WL1 through the third memory cell MC3. Therefore, by detecting the presence or absence of a current related to the first word line WL1, it is possible to determine presence or absence of writing related to the first memory cell MC1.

In FIG. 11, the voltage V4' at the time point t22 is shown as 0V, but in reality, the electrode unit 31 of the second columnar body 30B is in the floating state insulated from the whole wirings, so that a potential is indefinite. For example, when the number of stacked layers of the stacked bodies 20 increases, the voltage V4' at the time point t22 is affected by the voltage V5' applied to the second word line WL2 and becomes a potential near the predetermined voltage (Vr/2). This also applies to the voltage V4" and the voltage V4'" in the description of FIGS. 12 and 13 described later.

(Read Operation Related to Second Combination)

Figure 12:
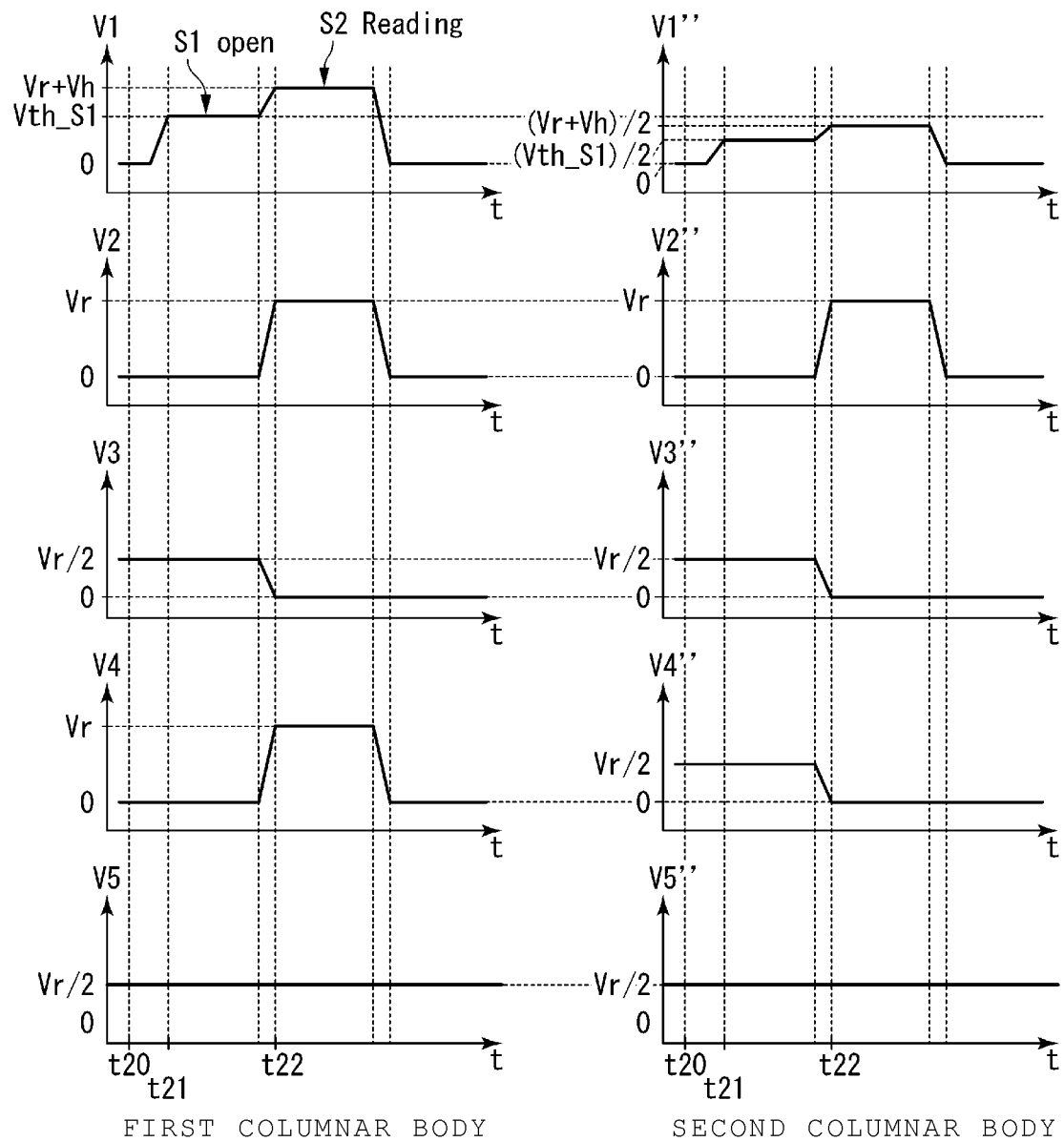
FIG. 12 is a diagram illustrating a read operation related to the second combination of the first embodiment.

FIG. 12 is a diagram illustrating a read operation related to the second combination. Here, the read operation related to the first memory cell MC1 of the first columnar body 30A will be described.

As shown in FIG. 12, at the time point t20 before the read operation is started, the predetermined voltage (Vr/2), which is half of the read voltage Vr, is applied to the first word line WL1 and the second word line WL2.

When the read operation is started, the predetermined voltage Vth_S1 for making the selection layer 35 in the conductive state is applied to the first source line SL1 at the time point t21. At the time point t21, the voltage applied to the bit line BL is controlled to 0V. As a result, the predetermined voltage Vth_S1 is applied to the selection layer 35 of the first columnar body 30A, and the selection layer 35 of the first columnar body 30A is switched to the conductive state.

Meanwhile, at the time point t21, the voltage (Vth_S1/2), which is half of the predetermined voltage Vth_S1, is applied to the second source line SL2. Therefore, a voltage equal to or higher than the first threshold voltage Vth is not applied to the selection layer 35 of the second columnar body 30B. As a result, the selection layer 35 of the second columnar body 30B maintains the non-conductive state.

Next, at the time point t22, the predetermined voltage (Vr+Vh) is applied to the first source line SL1. At the time point t22, the read voltage Vr is applied to the bit line BL. As a result, the read voltage Vr is applied to the first memory cell MC1. Here, when the first memory cell MC1 is being written, the first memory cell MC1 has the threshold voltage Vff higher than the read voltage Vr. Therefore, the first memory cell MC1 does not change to the conductive state. As a result, no current flows to the first word line WL1 through the first memory cell MC1.

At the time point t22, the predetermined voltage ((Vr+Vh)/2), which is half of the predetermined voltage (Vr+Vh), is applied to the second source line SL2. Therefore, a voltage equal to or higher than the first threshold voltage Vth is not applied to the selection layer 35 of the second columnar body 30B. As a result, the selection layer 35 of the second columnar body 30B maintains the non-conductive state, and the third memory cell MC3 maintains the non-conductive state. Therefore, no current flows to the first word line WL1 through the third memory cell MC3. Therefore, by detecting the presence or absence of the current related to the first word line WL1, it is possible to determine the presence or absence of the writing related to the first memory cell MC1.

(Read Operation Related to Third Combination)

Figure 13:
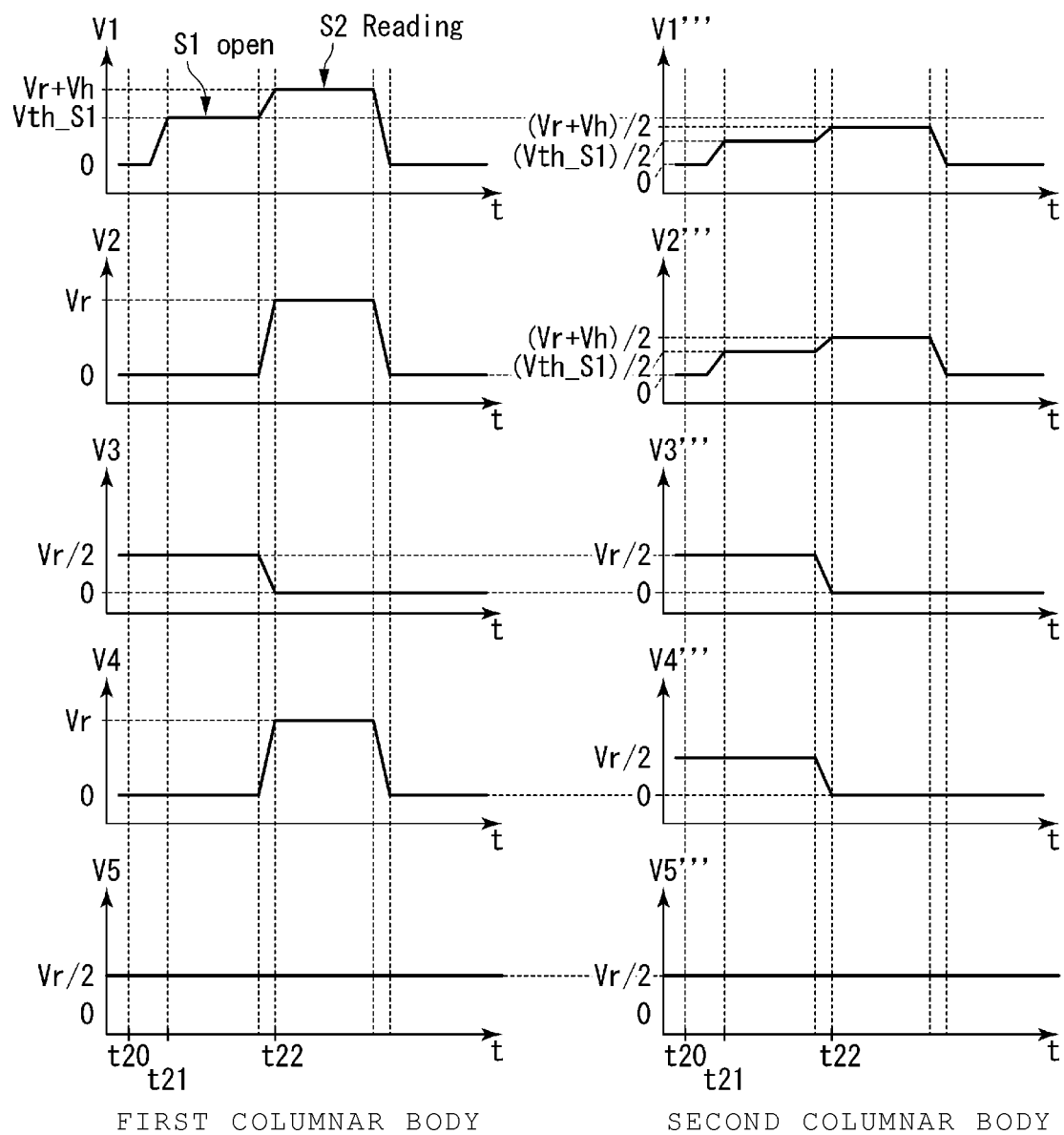
FIG. 13 is a diagram illustrating a read operation related to the third combination of the first embodiment.

FIG. 13 is a diagram illustrating a read operation related to the third combination. Here, the read operation related to the first memory cell MC1 of the first columnar body 30A will be described.

As shown in FIG. 13, first, at the time point t20 before the read operation is started, the predetermined voltage (Vr/2), which is half of the read voltage Vr, is applied to the first word line WL1 and the second word line WL2.

When the read operation is started, the predetermined voltage Vth_S1 for making the selection layer 35 in the conductive state is applied to the first source line SL1 at the time point t21. At the time point t21, the voltage applied to the first bit line BL1 is controlled to 0V. As a result, the predetermined voltage Vth_S1 is applied to the selection layer 35 of the first columnar body 30A, and the selection layer 35 of the first columnar body 30A is switched to the conductive state.

Meanwhile, at the time point t21, the voltage (Vth_S1/2), which is half of the predetermined voltage Vth_S1, is applied to the second source line SL2 and the second bit line BL2. Therefore, a voltage equal to or higher than the first threshold voltage Vth is not applied to the selection layer 35 of the second columnar body 30B. As a result, the selection layer 35 of the second columnar body 30B maintains the non-conductive state.

Next, at the time point t22, the predetermined voltage (Vr+Vh) is applied to the first source line SL1. At the time point t22, the read voltage Vr is applied to the first bit line BL1. As a result, the read voltage Vr is applied to the first memory cell MC1. Here, when the first memory cell MC1 is being written, the first memory cell MC1 has the threshold voltage Vff higher than the read voltage Vr. Therefore, the first memory cell MC1 does not change to the conductive state. As a result, no current flows to the first word line WL1 through the first memory cell MC1.

At the time point t22, the predetermined voltage ((Vr+Vh)/2), which is half of the predetermined voltage (Vr+Vh), is applied to the second source line SL2. Therefore, a voltage equal to or higher than the first threshold voltage Vth is not applied to the selection layer 35 of the second columnar body 30B. As a result, the selection layer 35 of the second columnar body 30B maintains the non-conductive state and the third memory cell MC3 maintains the non-conductive state. Therefore, no current flows to the first word line WL1 through the third memory cell MC3. Therefore, by detecting the presence or absence of the current related to the first word line WL1, it is possible to determine the presence or absence of the writing related to the first memory cell MC1.

<4. Manufacturing Method>

Next, a manufacturing method of the semiconductor memory device 1 will be described.

Figure 14:
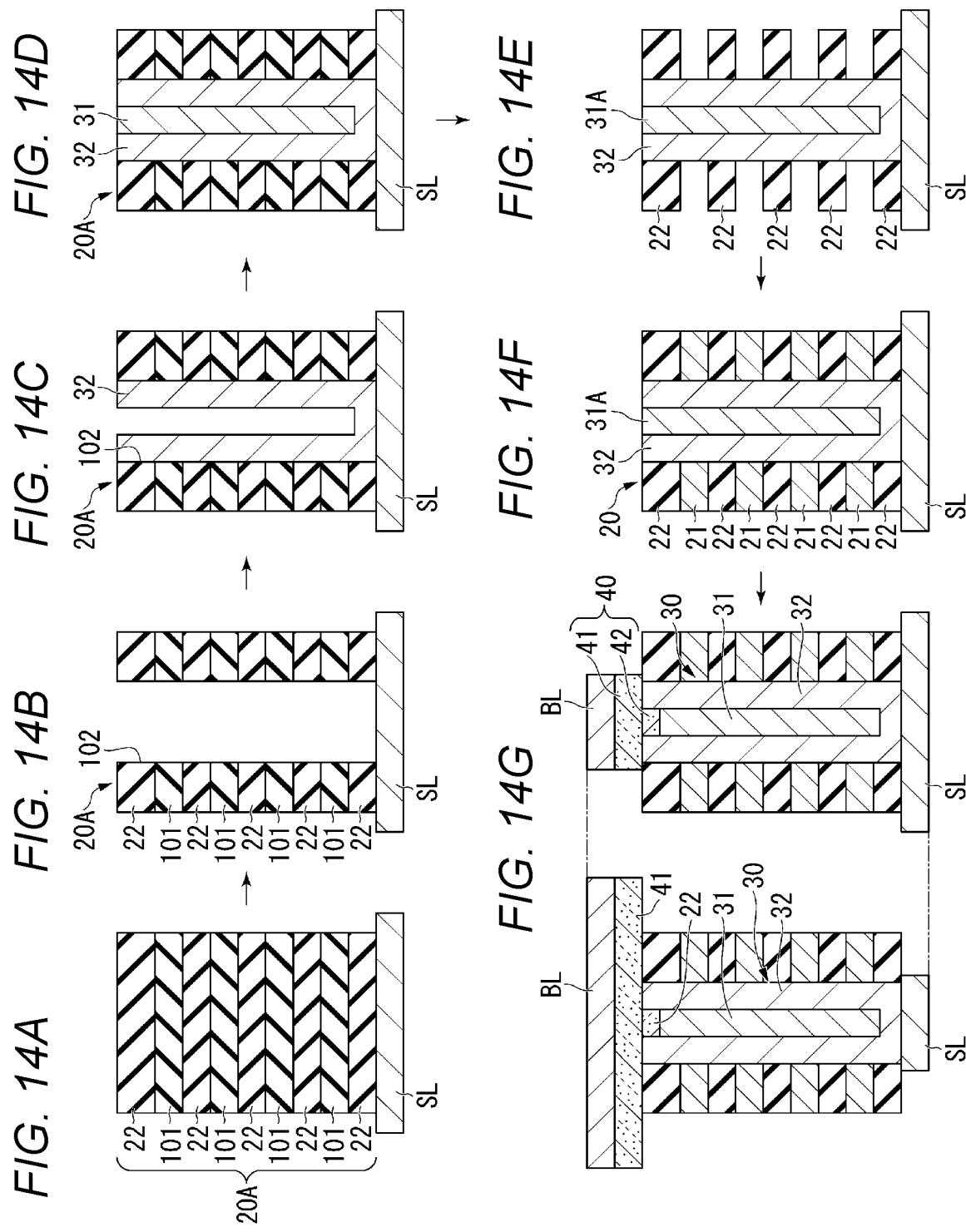
FIGS. 14A to 14G are diagrams illustrating a manufacturing method of the semiconductor memory device of the first embodiment.

FIGS. 14A to 14G are diagrams illustrating the manufacturing method of the semiconductor memory device 1. First, as shown in FIG. 14A, the source line SL is formed, for example, on a semiconductor substrate (not shown). Next, the insulating layer 22 and a sacrifice layer 101 are alternately stacked one by one on the source line SL to form an intermediate stacked body 20A. The sacrifice layer 101 is a layer that is replaced with the conductive layer 21 in a later process. The sacrifice layer 101 is formed of, for example, silicon nitride.

Next, as shown in FIG. 14B, a hole 102 for providing the columnar body 30 is formed in the intermediate stacked body 20A. The hole 102 is formed by, for example, RIE (reactive ion etching).

Next, as shown in FIG. 14C, the material of the selector film 32 is supplied to an inner surface of the hole 102 and the selector film 32 is formed. As a result, the selector film 32 is formed in a bottomed annular shape along the inner surface of the hole 102 and a surface of the source line SL. The selector film 32 may be formed by using a method such as ALD (Atomic Layer Deposition) or CVD (Chemical Vapor Deposition).

Next, as shown in FIG. 14D, a material of the electrode unit 31 is supplied to inside of the annular selector film 32. As a result, an electrode unit 31A is formed in the annular selector film 32. The electrode unit 31A may be formed by using the method such as ALD or CVD.

Next, as shown in FIG. 14E, the sacrifice layer 101 is removed by wet etching using an opening (not shown). Next, as shown in FIG. 14F, the conductive layer 21 is formed by supplying the conductive material to a space from which the sacrifice layer 101 is removed. As a result, the stacked body 20 is formed from the intermediate stacked body 20A.

Next, as shown in FIG. 14G, an impurity for forming the P-type semiconductor is doped in an upper end portion of the electrode unit 31A, whereby the second semiconductor unit 42 of the diode 40 is formed from the upper end portion of the electrode unit 31A. In various embodiments, the undoped portion of the electrode unit 31A remains as the electrode unit 31.

Next, the first semiconductor unit 41 of the diode 40 is formed on the stacked body 20. The first semiconductor unit 41 extends in the X direction so as to be commonly provided for, for example, the plurality of columnar bodies 30 (a plurality of second semiconductor units 42). Next, the bit line BL is formed on the first semiconductor unit 41 of the diode 40. As a result, the semiconductor memory device 1 is manufactured.

<5. Advantages>

As a comparative example, a semiconductor memory device provided with a MOSFET (Metal-Oxide-Semiconductor Field-Effect Transistor) as a selection element between the electrode unit of the columnar body and the wiring is considered. In a configuration of this comparative example, since a current flowing between the wiring and the electrode unit is a current passing through the MOSFET, it is difficult to secure a large current. As a result, it becomes difficult to reduce the size of the MOSFET and improve a degree of integration of the semiconductor memory device.

Meanwhile, in the present embodiment, the columnar body 30 and the diode 40 are provided. The columnar body 30 includes the electrode unit 31 disposed between the first wiring (for example, the source line SL) and the second wiring (for example, the bit line BL) and extending in the stacked body 20, the memory layer 36 disposed between the electrode unit 31 and the plurality of conductive layers 21, and the selection layer 35 disposed between the electrode unit 31 and the first wiring. The diode 40 is disposed between the electrode unit 31 and the second wiring. According to such a configuration, the size of the selection element (selection layer 35) disposed between the electrode unit of the columnar body and the wiring can be reduced as compared with the case where the MOSFET is disposed, for example. Further, according to the above configuration, a structure provided in the semiconductor memory device 1 can be simplified. Thereby, the degree of integration of the semiconductor memory device 1 can be improved.

In the present embodiment, the columnar body 30 includes the selector film 32 along the electrode unit 31. The selection layer 35 and the memory layer 36 each are a part of the selector film 32. According to such a configuration, the selection layer 35 and the memory layer 36 can be formed by one film. As a result, the structure of the semiconductor memory device 1 can be further simplified and the degree of integration can be further improved.

In the present embodiment, the selector film 32 contains one or more of sulfur, selenium, and tellurium. According to such a configuration, it is possible to obtain the selection layer 35 having a large range of change in a threshold voltage due to a state change. This makes it possible to improve electrical characteristics of the semiconductor memory device 1.

In the present embodiment, the upper end 31e of the electrode unit 31 is located below the upper end 32be of the annular portion 32b. A part of the diode 40 is provided in the upper end portion 32bu of the annular portion 32b. According to such a configuration, a total height of the columnar body 30 and the diode 40 can be reduced as compared with the case where all of the diodes 40 are provided outside the annular portion 32b. Thereby, the degree of integration of the semiconductor memory device 1 can be further improved.

In the present embodiment, the diode 40 includes the first semiconductor unit 41 facing the selector film 32 in the Z direction and the semiconductor unit 42 provided in the upper end portion 32bu of the annular portion 32b and having a polarity different from that of the first semiconductor unit 41. According to such a configuration, it becomes easy to separately make the first semiconductor unit 41 and the second semiconductor unit 42 to which different impurities are doped. Thereby, manufacturability of the semiconductor memory device 1 can be improved.

Second Embodiment

Next, a second embodiment will be described. In the second embodiment, positions of the selection layer 35 and the diode 40 are different from those in the first embodiment. The configuration other than that described below is the same as that of the first embodiment.

Figure 15:
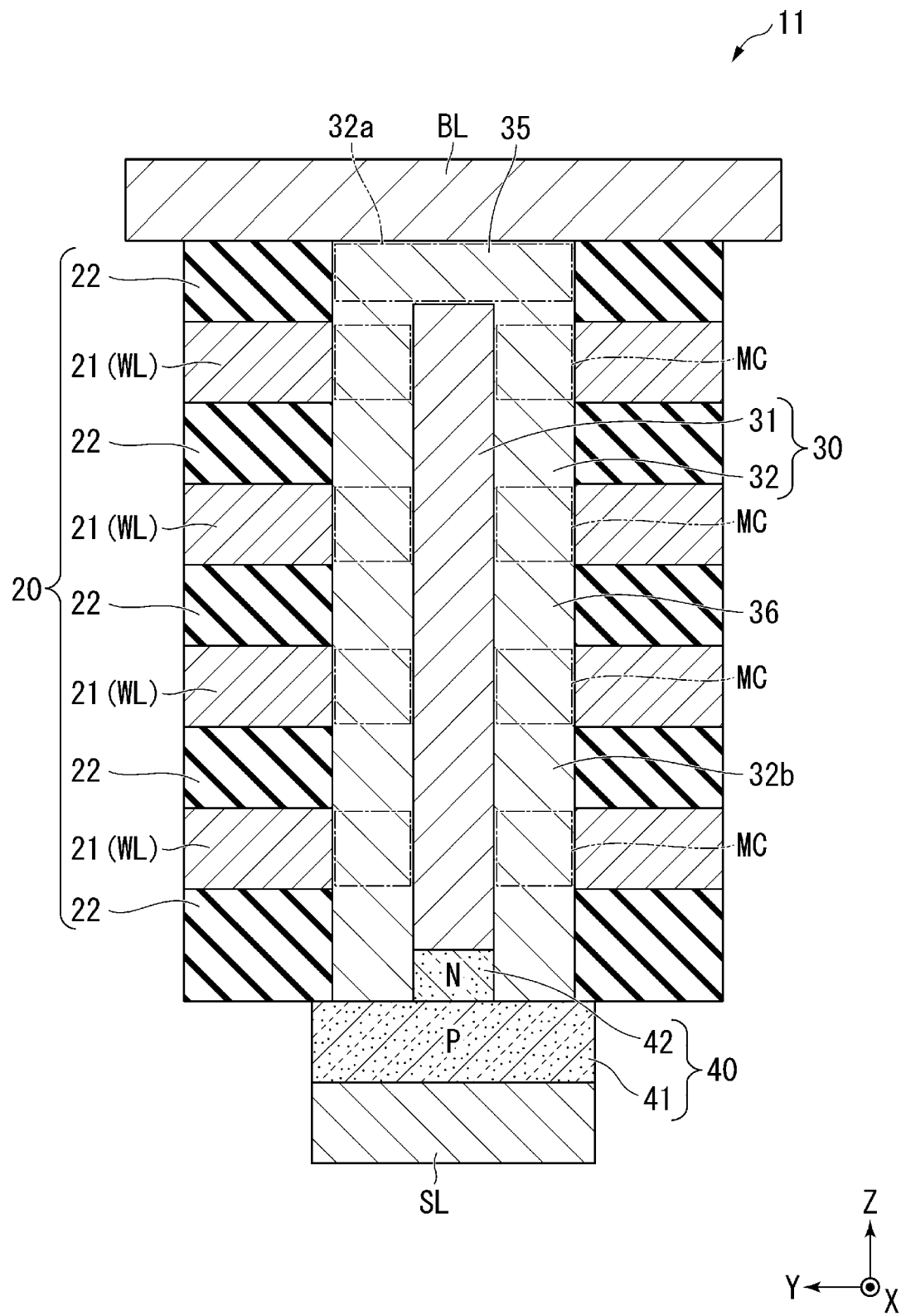
FIG. 15 is a cross-sectional view showing a part of a memory cell array of a second embodiment.

FIG. 15 is a cross-sectional view showing a part of the memory cell array 11 of the second embodiment. In the second embodiment, the selection layer 35 is disposed above the electrode unit 31 of the columnar body 30. The selection layer 35 is disposed between the electrode unit 31 of the columnar body 30 and the bit line BL. In the present embodiment, the bit line BL is an example of the "first wiring".

Meanwhile, the diode 40 is disposed below the electrode unit 31 of the columnar body 30. The diode 40 is disposed between the electrode unit 31 of the columnar body 30 and the source line SL. The anode of the diode 40 is connected to the source line SL. The cathode of the diode 40 is connected to the electrode unit 31 of the columnar body 30. The first semiconductor unit 41 includes the P-type semiconductor. The second semiconductor unit 42 includes the N-type semiconductor. In the present embodiment, the source line SL is an example of the "second wiring". Even with such a configuration, it is possible to improve an integration density as in the first embodiment.

Third Embodiment

Next, a third embodiment will be described. In the third embodiment, a material contained in the electrode unit 31 is different from that in the first embodiment. The configuration other than that described below is the same as that of the first embodiment.

Figure 16:
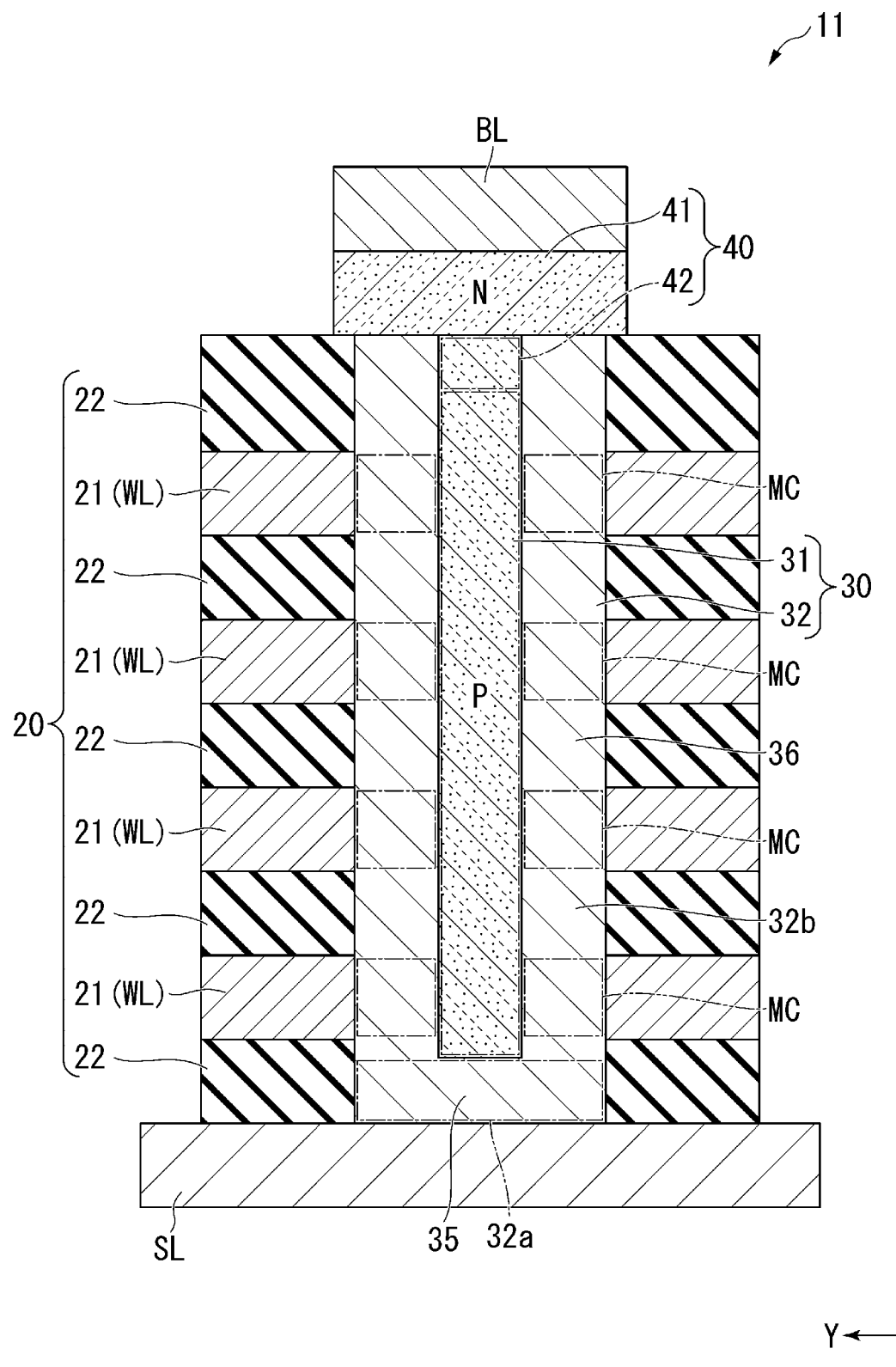
FIG. 16 is a cross-sectional view showing a part of a memory cell array of a third embodiment.

FIG. 16 is a cross-sectional view showing a part of the memory cell array 11 of the third embodiment. In the third embodiment, the electrode unit 31 of the columnar body 30 and the second semiconductor unit 42 of the diode 40 are integrally formed of a semiconductor containing impurities (for example, the P-type semiconductor).

Even with such a configuration, the same effect as that of the first embodiment can be obtained. When the electrode unit 31 is formed of the conductive material as in the first embodiment, an electric resistance of the electrode unit 31 is reduced, and thus power consumption is reduced.

Although some embodiments are described above, the embodiments are not limited to the above examples. For example, the second embodiment and the third embodiment may be implemented in combination.

Figure 17:
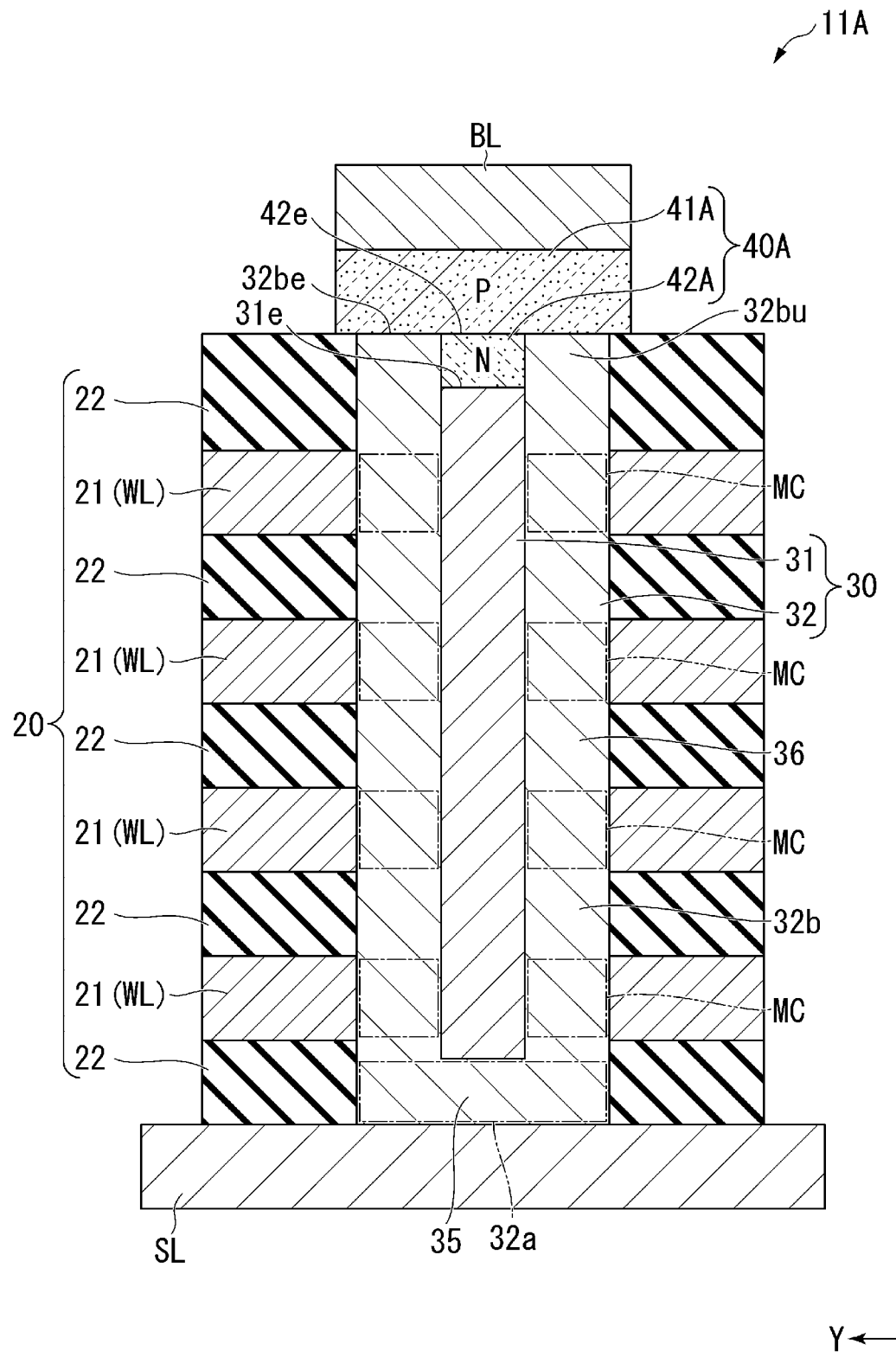
FIG. 17 is a cross-sectional view showing a part of a memory cell array of a modification of the embodiment.

FIG. 17 is a cross-sectional view showing a part of a memory cell array 11A of a modification of the embodiment. FIG. 17 shows the memory cell array 11A of the modification having a configuration similar to that of the memory cell array 11 of the first embodiment. A diode 40A of the memory cell array 11A of the present modification has an opposite direction of the PN junction to the diode 40 of the memory cell array 11 of the first embodiment. That is, the diode 40A includes a first semiconductor unit 41A including the P-type semiconductor, and a second semiconductor unit 42A including the N-type semiconductor. The first semiconductor unit 41A is disposed between the bit line BL and the second semiconductor unit 42A. The second semiconductor unit 42A is disposed between the first semiconductor unit 41A and the electrode unit 31 of the columnar body 30. In the present modification, a voltage inverted from the voltage described in the first embodiment is applied to the source line SL and the bit line BL. Even with such a configuration, the same effect as that of the first embodiment can be obtained. The present modification may be implemented in combination with the second embodiment and the third embodiment described above.

According to at least one embodiment described above, the semiconductor memory device includes a columnar body and a diode. The columnar body includes an electrode unit disposed between a first wiring and a second wiring and extending in a stacked body, a memory layer disposed between the electrode unit and a plurality of conductive layers, and a selection layer disposed between the electrode unit and the first wiring. The diode is disposed between the electrode nit and the second wiring. According to such a configuration, the integration density can be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
   a first wiring extending in a first direction;
   a second wiring extending in a second direction intersecting the first direction and spaced from the first wiring in a third direction intersecting the first direction and the second direction;
   a stacked body disposed between the first wiring and the second wiring and including a plurality of conductive layers and a plurality of insulating layers, wherein the plurality of conductive layers and the plurality of insulating layers are alternately stacked on top of one another in the third direction;
   a columnar body including: (a) an electrode disposed between the first wiring and the second wiring and extending in the third direction through the stacked body, (b) a memory layer disposed between the electrode and the plurality of conductive layers, and (c) a selection layer disposed between the electrode and the first wiring; and
   a diode disposed between the electrode and the second wiring;
   wherein the columnar body includes a first film along the electrode, and the selection layer and the memory layer each are a portion of the first film.

2. The semiconductor memory device according to claim 1, wherein
   the memory layer includes a plurality of memory cells, each of which is disposed between a corresponding one of the plurality of conductive layers and the electrode, and
   wherein a threshold voltage of each of the memory cells for switching an electrical connection state between the corresponding conductive layer and the electrode is changed when a first predetermined voltage is applied to the memory cell so as to store a data value.

3. The semiconductor memory device according to claim 2, wherein
   before the first predetermined voltage is applied, when a voltage equal to or higher than a first threshold voltage is applied, the memory cell is switched from a non-conductive state to a conductive state, and
   after the first predetermined voltage is applied, when a voltage equal to or higher than a second threshold voltage higher than the first threshold voltage is applied, the memory cell is switched from the non-conductive state to the conductive state.

4. The semiconductor memory device according to claim 1, wherein
   the first film includes at least one of sulfur, selenium, or tellurium.

5. The semiconductor memory device according to claim 1, wherein
   the first film includes an annular portion that surrounds a peripheral surface of the electrode and extends in the third direction.

6. The semiconductor memory device according to claim 5, wherein
   an end of the electrode is located below an end of the annular portion, and
   a portion of the diode is provided in an end portion of the annular portion adjacent to the end of the annular portion.

7. The semiconductor memory device according to claim 6, wherein
   the diode includes a first semiconductor layer facing the first film in the third direction and having a first polarity, and a second semiconductor layer provided in the end portion of the annular portion and having a polarity different from the first polarity.

8. The semiconductor memory device according to claim 1, further comprising:
a control circuit, wherein
the plurality of conductive layers include a first conductive layer,
the memory layer includes a first memory cell between an electrode unit and the first conductive layer, and
when a write operation to the first memory cell is performed, the control circuit is configured to control respective voltage states of the first wiring, the second wiring, and the first conductive layer so that a first predetermined voltage is applied between the electrode and the first conductive layer.

9. The semiconductor memory device according to claim 8, wherein
when a read operation for the first memory cell is performed, the control circuit is configured to control the respective voltage states of the first wiring and the second wiring so that a second predetermined voltage is applied between the electrode and the first conductive layer, and perform detection related to a current flowing through the first conductive layer.

10. A method for fabricating semiconductor memory devices, comprising:
forming, over a first wiring extending in a first lateral direction, a stacked body including a plurality of conductive layers and a plurality of sacrificial layers alternately stacked on top of one another in a vertical direction;
forming an opening extending through the stack to the first wiring;
forming a selector film lining the opening;
filling a remaining portion of the opening with an electrode;
forming a diode with a first layer disposed above a top surface of the stack and a second layer disposed below the top surface of the stack; and
forming, over the stack, a second wiring extending in a second lateral direction.

11. The method according to claim 10, wherein the selector film includes at least one of sulfur, selenium, or tellurium.

12. The method according to claim 10, wherein the selector film includes at least one of chalcogenide of sulfur, chalcogenide of selenium, or chalcogenide of tellurium.

13. The method according to claim 10, wherein the selector film includes an annular portion that surrounds a peripheral surface of the electrode and extends in the vertical direction.

14. The method according to claim 10, further comprising doping an end portion of the electrode to form the second layer.

15. The method according to claim 10, wherein the first and second layers of the diode have opposite polarities.

16. The method according to claim 10, further comprising replacing the sacrificial layers with a plurality of insulating layers, respectively.

* * * * *